United States Patent
Zerbe et al.

(10) Patent No.: US 9,160,350 B2
(45) Date of Patent: Oct. 13, 2015

(54) INTEGRATED CIRCUIT COMPRISING A DELAY-LOCKED LOOP

(71) Applicant: Rambus Inc., Sunnyvale, CA (US)

(72) Inventors: Jared L. Zerbe, Woodside, CA (US); Masum Hossain, Sunnyvale, CA (US); Pak S. Chau, Saratoga, CA (US)

(73) Assignee: RAMBUS INC., Sunnyvale, CA (US)

( * ) Notice: Subject to any disclaimer, the term of this patent is extended or adjusted under 35 U.S.C. 154(b) by 391 days.

(21) Appl. No.: 13/676,945

(22) Filed: Nov. 14, 2012

(65) Prior Publication Data

US 2013/0121094 A1 May 16, 2013

Related U.S. Application Data

(60) Provisional application No. 61/560,000, filed on Nov. 15, 2011, provisional application No. 61/635,097, filed on Apr. 18, 2012, provisional application No. 61/701,469, filed on Sep. 14, 2012.

(51) Int. Cl.

| | |
|---|---|
| *H03L 7/06* | (2006.01) |
| *H03L 7/091* | (2006.01) |
| *G11C 8/18* | (2006.01) |
| *H03K 5/156* | (2006.01) |

(Continued)

(52) U.S. Cl.
CPC .............. *H03L 7/091* (2013.01); *G11C 7/1057* (2013.01); *G11C 7/222* (2013.01); *G11C 8/18* (2013.01); *H03K 5/1565* (2013.01); *H03L 7/0802* (2013.01); *H03L 7/083* (2013.01); *H03L 7/0814* (2013.01); *H03L 7/0816* (2013.01); *H03L 7/0995* (2013.01); *H03L 7/104* (2013.01); *G11C 7/04* (2013.01)

(58) Field of Classification Search
CPC ....... H03L 7/06; H03L 7/0812; H03L 7/0814; H03L 7/0816; H03L 7/0805; H03L 7/091; H03K 5/1565
USPC .................................................... 327/149, 158
See application file for complete search history.

(56) References Cited

U.S. PATENT DOCUMENTS

| | | | |
|---|---|---|---|
| 6,731,667 B1 * | 5/2004 | Lee et al. ...................... | 375/130 |
| 7,088,159 B2 * | 8/2006 | Kwak et al. ................... | 327/161 |

(Continued)

OTHER PUBLICATIONS

Helal, Belal et al. "A Low Jitter Programmable Clock Multiplier Based on a Pulse Injection-Locked Oscillator With a Highly-Digital Tuning Loop", IEEE Journal of Solid-State Circuits, vol. 44, No. 5, pp. 1391-1400, May 2009. 11 pages.

(Continued)

*Primary Examiner* — Hai L Nguyen
(74) *Attorney, Agent, or Firm* — Park, Vaughan, Fleming & Dowler LLP

(57) ABSTRACT

Embodiments of an integrated circuit (IC) comprising a delay-locked loop (DLL) are described. Some embodiments include first circuitry to generate a first clock signal by delaying an input clock signal by a first delay, second circuitry to determine a code based on the input clock signal and the first clock signal, and third circuitry to produce an output clock signal based on the input clock signal and the code. In some embodiments, the power consumption of the DLL circuitry is reduced by powering down at least some parts of the DLL circuitry for most of the time. In some embodiments, the clock signal that is used to clock the command-and-address circuitry of a memory device is used to clock the on-die-termination latency counter circuitry.

20 Claims, 32 Drawing Sheets

(51) Int. Cl.
*H03L 7/08* (2006.01)
*H03L 7/081* (2006.01)
*H03L 7/083* (2006.01)
*H03L 7/099* (2006.01)
*H03L 7/10* (2006.01)
*G11C 7/10* (2006.01)
*G11C 7/22* (2006.01)
*G11C 7/04* (2006.01)

(56) References Cited

U.S. PATENT DOCUMENTS

| | | | |
|---|---|---|---|
| 7,142,027 B2 * | 11/2006 | Lee et al. | 327/158 |
| 7,388,415 B2 | 6/2008 | Lee | |
| 7,613,064 B1 | 11/2009 | Wagner et al. | |
| 7,642,823 B2 | 1/2010 | Cho | |
| 7,728,638 B2 | 6/2010 | Varricchione | |
| 7,773,435 B2 | 8/2010 | Cho | |
| 7,876,137 B2 | 1/2011 | Heightley | |
| 8,040,752 B2 | 10/2011 | Fujisawa | |
| 8,044,679 B2 | 10/2011 | Kim | |
| 2008/0272812 A1 | 11/2008 | Cho | |
| 2009/0167441 A1 | 7/2009 | Song et al. | |
| 2009/0175116 A1 | 7/2009 | Song et al. | |
| 2010/0142296 A1 | 6/2010 | You | |
| 2010/0231275 A1 | 9/2010 | Kitagawa | |
| 2011/0058442 A1 | 3/2011 | Fujisawa | |

OTHER PUBLICATIONS

Hossain, Masum et al. "7.4 Gb/s 6.8 mW Source Synchronous Receiver in 65 nm CMOS" IEEE Journal of Solid-State Circuits, vol. 46, No. 6, pp. 1337-1348, Jun. 2011. 12 pages.
Hu, Kangmin et al., "A 0.6 mW/Gb/s, 6.4-7.2 Gb/s Serial Link Receiver Using Local Injection-Locked Ring Oscillators in 90 nm CMOS," IEEE Journal of Solid-State Circuits, vol. 45, No. 4, Apr. 2010, pp. 899-908. 10 pages.
Kim, Mi-Jo et al, "A 100MHz-to1GHz Open-Loop ADDLL with Fast Lock-Time for Mobile Applications", Custom Integrated Circuits Conference (CICC), Sep. 19-22, 2010, San Jose, CA, pp. 1-4. 4 pages.
Lee, Ki-Won et al. "A 1.5V 3.2 Gb/s/pin Graphic DDR4 SDRAM With Dual-Clock System, Four-Phase Input Strobing, and Low-Jitter Fully Analog DLL", IEEE Journal of Solid-State Circuits, vol. 42, No. 11, pp. 2369-2377, Nov. 2007. 9 pages.
Liang, Chuan-Kang et al. "An All-Digital Fast-Locking Programmable DLL-Based Clock Generator", Circuits and Systems I: Regular Papers, vol. 55, No. 1, pp. 361-369, Feb. 2008. 9 pages.
NG et al. "A Second-Order Semidigital Clock Recovery Circuit Based on Injection Locking", IEEE Journal of Solid-State Circuits, vol. 38 No. 12, Dec. 2003, pp. 2101-2110, plus corresponding ISSCC 2003 Session 4 paper 4.3. 18 pages.
Rategh, H.R., et al., "Superharmonic Injection-Locked Frequency Dividers," IEEE Journal of Solid-State Circuits, 34(6): 813-821 (Jun. 1999). 9 pages.
O'Mahony, Frank et al. "A Programmable Phase Rotator based on Time-Modulated Injection-Locking" 2010 IEEE Symposium on VLSI Circuits (VLSIC), Honolulu, HI, Jun. 16-18, 2010, pp. 45-46. 2 pages.
Dehng, Guang-Kaai et al "A Fast-Lock Mixed-Mode DLL Using a 2-b SAR Algorithm", IEEE Journal of Solid-State Circuits, vol. 36, No. 10, pp. 1464-1471, Oct. 2001. 8 pages.
Hossain, Masum et al., "CMOS Oscillators for Clock Distribution and Injection-Locked Deskew" IEEE Journal of Solid-State Circuits, vol. 44, No. 8, pp. 2138-2153, Aug. 2009. 16 pages.
Hu, Kangmin et al., "A 0.6 mW/Gb/s, 6.4-T2 Gb/s Serial Link Receiver Using Local Injection-Locked Ring Oscillators in 90 nm CMOS," IEEE Journal of Solid-State Circuits, vol. 45, No. 4, Apr. 2010, pp. 899-908. 10 pages.
Hossain, Masum et al., "A 6.8mW 7.4Gb/s Clock-Forwarded Receiver with up to 300MHz Jitter Tracking in 65nm CMOS," ISSCC 2010, Session 8, High-Speed Wireline Transceivers 8.2, p. 158-160. 3 pages.
Carusone, Tony Chan, "Injection-Locking for High-Speed Wireline Communication," University of Toronto, Apr. 15, 2010. 14 pages.
Vanassche, et al., "On the Difference between Two Widely Publicized Methods for Analyzing Oscillator Phase Behavior," 2002, IEEE, p. 229-233. 5 pages.
Hossain, et al., "5-10 Gb/s 70 mW Burst Mode AC Coupled Receiver in 90-nm CMOS," IEEE Journal of Solid-State Circuits, vol. 45, No. 3, Mar. 2010, p. 524-537. 14 pages.
Jaussi et al., "A 20Gb/s Embedded Clock Transceiver in 90nm CMOS," 18.8, ISSCC 2006 Session 18. 10 pages.
Casper et al., "A 20Gb/s Forwarded Clock Transceiver in 90nm CMOS," 4.6, ISSCC 2006 Session 4. 10 pages.
Maffezzoni, Paolo, "Analysis of Oscillator Injection Locking Through Phase-Domain Impulse-Response," IEEE Transactions on Circuits and Systems—I: Regular Papers, vol. 55, No. 5, Jun. 2008, p. 1297-1305. 9 pages.
Lai et al., "Capturing Oscillator Injection Locking via Nonlinear Phase-Domain Macromodels," IEEE Transactions on Microwave Theory and Techniques, vol. 52, No. 9, Sep. 2004, p. 2251-2261. 11 pages.
Mahony et al., "A 27Gb/s Forwarded-Clock I/O Receiver Using an Injection-Locked LC-DCO in 45nm CMOS," 25.1, ISSCC 2008 Session 25, p. 452-453, 627. 3 pages.
Mahony et al., "Paper 25.1: a 27Gb/s Forwarded-Clock I/O Receiver using an Injection-Locked LC-DCO in 45nm CMOS," IEEE International Solid-State Circuits 2008. 39 pages.
Hu et al., "A 0.6mW/Gbps, 6.4-8.0Gbps Serial Link Receiver Using Local Injection-Locked Ring Oscillators in 90nm CMOS," 2009 Symposium on VLSI Circuits Digest of Technical Papers. 2 pages.
Farjad-Rad, Ramin et al., "A 33-mW 8-Gb/s CMOS Clock Multiplier and CDR for Highly Integrated I/Os," IEEE Journal of Solid-State Circuits, vol. 39, No. 9, Sep. 2004, p. 1553-1561. 9 pages.
Razavi, Behzad, "A Study of Injection Locking and Pulling in Oscillators," IEEE Journal of Solid-State Circuits, vol. 39, No. 9, Sep. 2004, p. 1415-1424. 10 pages.
Adler, Robert, "A Study of Locking Phenomena in Oscillators," Jun. 1946, Proceedings of the I.R.E. And Waves and Electrons, p. 351-357. 7 pages.
Paciorek, L.J., "Injection Locking of Oscillators," Nov. 1965, Proceedings of the IEEE, vol. 53, No. 11, p. 1723-1728. 6 pages.
Zhang, Lin et al., "Injection-Locked Clocking: A New GHz Clock Distribution Scheme," IEEE 2006 Custom Integrated Circuits Conference (CICC), pp. 785-788. 4 pages.
Mirzaei, Ahmad et al., "Multi-Phase Injection Widens Lock Range of Ring-Oscillator-Based Frequency Dividers," IEEE Journal of Solid-State Circuits, vol. 43, No. 3, Mar. 2008, pp. 656-671. 16 pages.
Shekhar, Sudip et al., "Strong Injection Locking in Low-Q LC Oscillators: Modeling and Application in a Forwarded-Clock I/O receiver," IEEE Transactions on Circuits and Systems—I: Regular Papers, vol. 56, No. 8, Aug. 2009, pp. 1818-1829. 12 pages.
Lee, Jri et al., "Subharmonically Injection-Locked PLLs for Ultra-Low-Noise Clock Generation," ISSCC 2009, Session 5, 5.2, pp. 91-93. 3 pages.
Lee, Jri et al., "Paper 5.2: Subharmonically Injection-Locked PLLs for Ultra-Low-Noise Clock Generation," Slides, 2009 IEEE International Solid-State Circuits Conference. 32 pages.

* cited by examiner

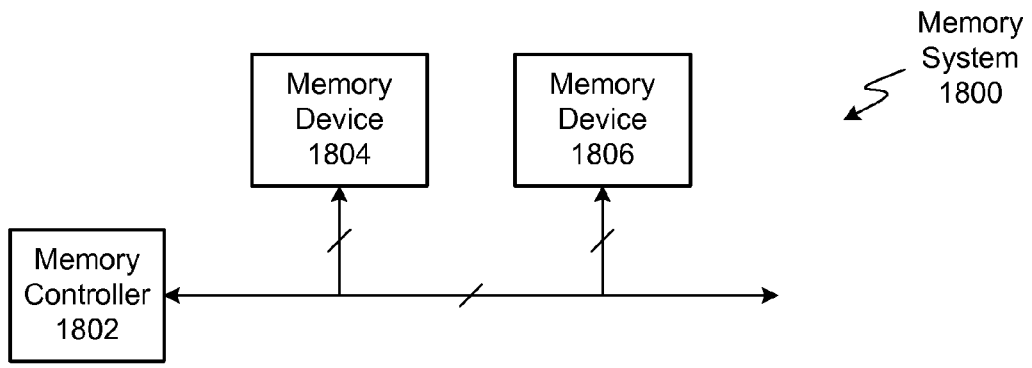

FIG. 18

Receive a value that represents an amount of delay that a first circuit is to apply to a signal before providing the signal to a second circuit, wherein the first circuit operates using a first clock signal, wherein the second circuit operates using a second clock signal, and wherein the amount of delay is represented with respect to the second clock signal
1902

Determine an offset between the first clock signal and the second clock signal
1904

Modify the value based on the offset
1906

FIG. 19

INTEGRATED CIRCUIT COMPRISING A DELAY-LOCKED LOOP

RELATED APPLICATION

This application claims priority to the following applications: (1) U.S. Provisional Application No. 61/560,000, entitled "Fast lock delay-locked loop," filed 15 Nov. 2011, which is herein incorporated by reference, (2) U.S. Provisional Application No. 61/635,097, entitled "Integrated circuit comprising a delay-locked loop," filed 18 Apr. 2012, which is herein incorporated by reference, and (3) U.S. Provisional Application No. 61/701,469, entitled "Integrated circuit comprising delay-locked loop control circuitry," filed 14 Sep. 2012, which is herein incorporated by reference.

BACKGROUND

This disclosure generally relates to electronic circuits. A delay-locked loop can be used to de-skew a clock signal. A conventional delay-locked loop can have a high power consumption profile and/or a slow lock time.

BRIEF DESCRIPTION OF THE FIGURES

FIG. 18 illustrates a memory system in accordance with some embodiments described herein.

FIG. 19 illustrates a process for modifying a latency counter value based on a skew between a CA clock and a DLL clock in accordance with some embodiments described herein.

DETAILED DESCRIPTION

In some embodiments described herein, a memory system reduces power consumption by selectively activating and deactivating individual memory devices or ranks. This approach for reducing power consumption, as well as other synchronous performance demands, requires the memory system to provide relatively precise timing to the individual memory devices or ranks. This can be achieved by de-skewing clock signals wherever necessary. Some embodiments described herein feature a delay-locked loop circuitry that can be used to de-skew a clock signal. Specifically, some embodiments described herein feature a delay-locked loop circuit that has lower power consumption, lower latency, faster lock time, and less jitter when compared to conventional delay-locked loop circuits. Some embodiments described herein achieve lower power reduction by reducing the lock time of the delay-locked loop so significantly as to facilitate activation of the delay-locked loop only when it is immediately needed and then powering it down for substantially most of the time it is not being used.

Figure 1A:
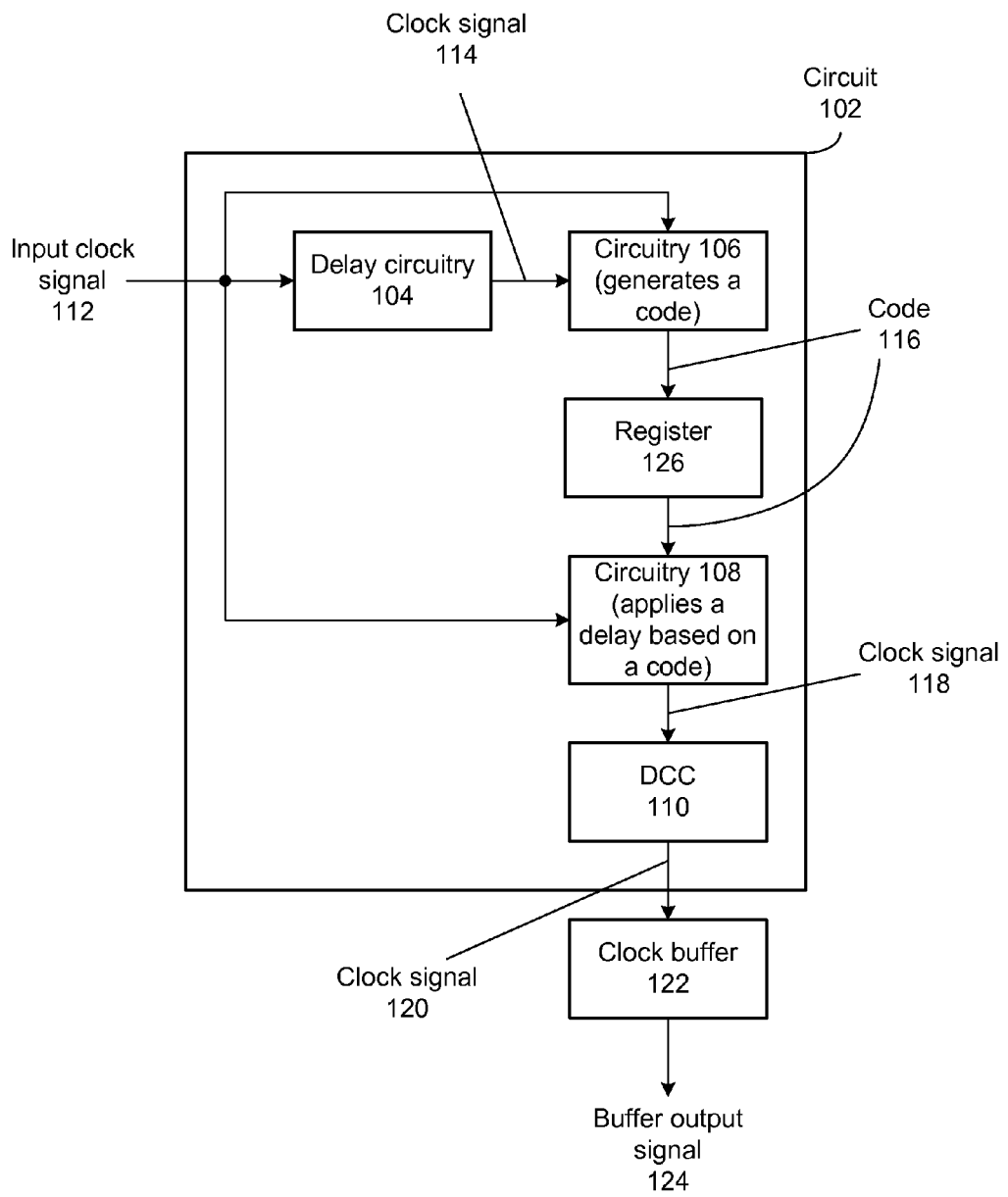
FIG. 1A illustrates circuitry in accordance with some embodiments described herein.

FIG. 1A illustrates circuitry in accordance with some embodiments described herein. In some embodiments described herein, circuit 102 includes optional delay circuitry 104, circuitry 106 to generate a code, an optional register 126 to store a code, circuitry 108 to apply a corresponding delay based on a code, and an optional duty-cycle corrector (DCC) 110.

In some embodiments described herein, delay circuitry 104 delays input clock signal 112 to produce clock signal 114. The delay of delay circuitry 104 can be substantially equal to the buffer delay of clock buffer 122. Circuitry 106 generates code 116 based on input signal 112 and clock signal 114. Code 116 is stored in register 126 (if present), or is directly provided to circuitry 108. Code 116 corresponds to a delay which, when applied to clock signal 114, produces a clock signal that has a phase delay with respect to input clock signal 112 that is substantially equal to a desired phase delay. In some embodiments, the desired phase delay is equal to zero. In this disclosure, the term "phase delay" refers to the non-integral portion of the clock skew when measured in clock cycles. For example, if the clock skew is equal to 2.6 clock cycles, then the term "phase delay" refers to a delay value of 0.6 clock cycles.

Code 116 generally refers to a set of signals that encodes the value of code 116. For example, code 116 refers to a set of n signals that corresponds to an n-bit binary representation of code 116. Circuitry 108 applies a delay to an input signal based on a code. Specifically, circuitry 108 delays input clock signal 112 to produce clock signal 118. The amount of delay applied by circuitry 108 depends on code 116.

Clock signal 118 (i.e., the output of circuitry 108) may contain pulses with different widths (e.g., due to deterministic jitter). Duty cycle corrector DCC 110 can be used to remove deterministic jitter from clock signal 118 by adjusting the pulse widths. When present, DCC 110 produces clock signal 120 whose high-pulse widths and low-pulse widths are substantially equal and constant. Clock signal 120 can then be provided as an input to clock buffer 122. In some embodiments described herein, clock signal 118 does not contain jitter or contains a negligible amount of jitter. In these embodiments, circuit 102 may not include DCC 110, and clock signal 118 may be directly provided as an input to clock buffer 122.

Clock buffer 122 generates buffer output signal 124 based on clock signal 120 (or clock signal 118 if circuit 102 does not include DCC 110). Buffer output signal 124 can be used as a clock signal for other circuitry, e.g., buffer output signal 124 can be provided as a clock signal to circuitry that drives a shared data bus.

According to one definition, a clock buffer is generally any circuitry that receives an input clock signal and generates an output clock signal that is used for driving the clock signal input(s) of one or more clock signal recipients. According to one definition, a clock signal recipient is generally any circuitry that operates based on a clock signal.

A clock buffer can introduce a phase delay in the clock signal. In some applications, the phase delay between a reference clock signal and the output of the clock buffer (which is provided as input to one or more clock signal recipients) is required to be substantially equal to a desired value (e.g., zero). The operation of adjusting the phase of a clock signal so that the clock signal's phase has substantially a desired phase delay with respect to the reference clock signal is referred to as de-skewing the clock signal, and the associated circuitry that performs the phase adjustment is referred to as clock de-skew circuitry.

In some embodiments described herein, circuit 102 is used to de-skew buffer output signal 124 so that buffer output signal 124 has a substantially zero phase delay with respect to input clock signal 112.

Some embodiments described herein use a parallel structure to perform de-skewing. Specifically, in circuit 102, input clock signal 112 is routed along the following parallel paths: a first parallel path that includes delay circuitry 104 and circuitry 106, and a second parallel path that includes circuitry 108. In particular, note that the code generation path (e.g., circuitry 106) and the code application path (e.g., circuitry 108) are parallel to each other.

Figure 1B:
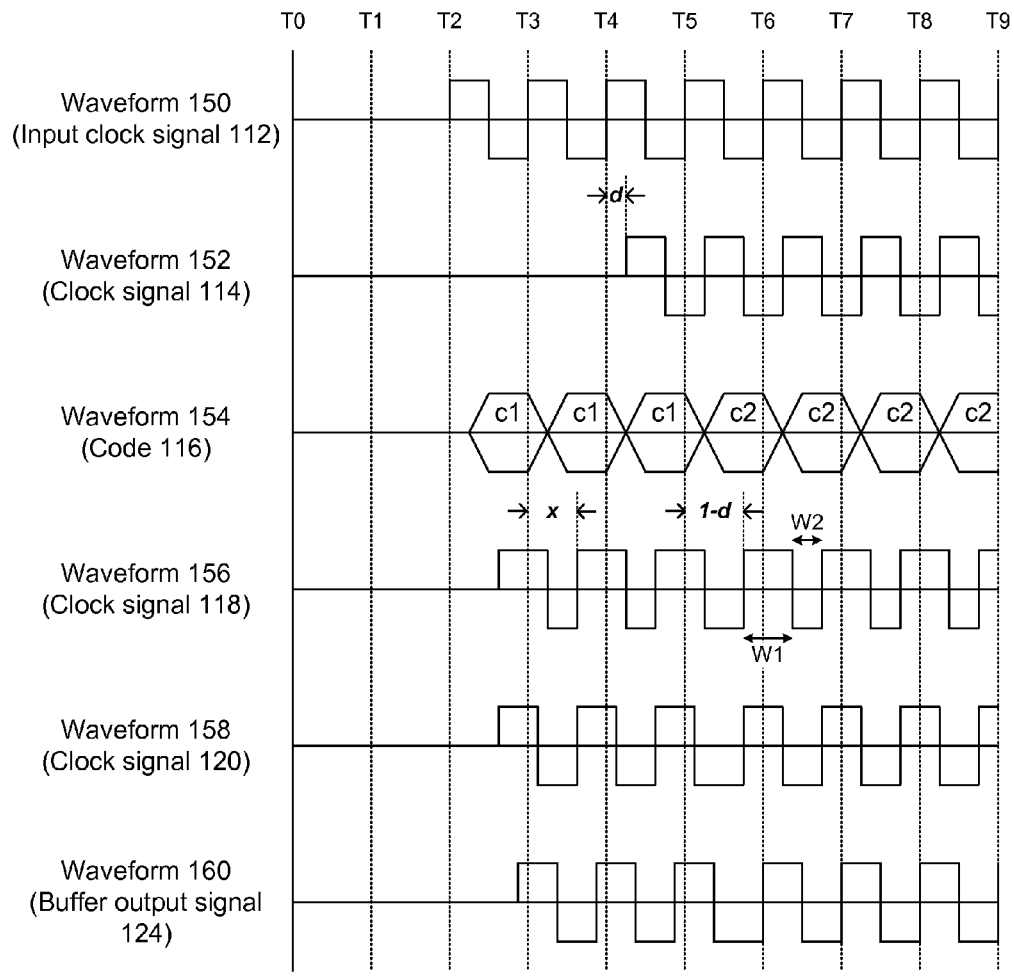
FIG. 1B illustrates some waveforms associated with the circuitry shown in FIG. 1A in accordance with some embodiments described herein.

FIG. 1B illustrates some waveforms associated with the circuitry shown in FIG. 1A in accordance with some embodiments described herein.

Waveforms 150, 152, 154, 156, 158, and 160 correspond to input clock signal 112, clock signal 114, code 116, clock signal 118, clock signal 120, and buffer output signal 122, respectively.

Waveform 152 has a phase delay "d" with respect to waveform 150. This phase delay can be substantially equal to the phase delay of clock buffer 122, i.e., the phase delay between the input signal (i.e., clock signal 120) and the output signal (e.g., buffer output signal 124) of clock buffer 122.

Waveform 154 shows the code that is generated by circuitry 106 and that is stored in optional register 126 (if present). When input clock signal 112 is turned on at time T2, circuitry 106 starts outputting the code "c1." Code "c1" can be a previously stored code, a default code, or a code that indicates that the delay-locked loop has not locked. In some embodiments, code "c1" may correspond to phase delay "x" which is shown in waveform 156. Once circuitry 106 locks onto clock signal 112, circuitry 106 starts outputting code "c2" which is different from code "c1." As illustrated in FIG. 1B, the parallel structure used in FIG. 1A substantially reduces the lock time. If the desired phase delay between input clock signal 112 and buffer output signal 124 is zero, then code "c2" corresponds to the phase delay "1-d." Circuitry 108 uses code "c2" to apply a delay to input clock signal 112 to produce clock signal 118, which is illustrated in waveform 156. Note that waveform 156 has a phase delay "1-d" with respect to waveform 150.

Waveform 156 has deterministic jitter. Specifically, each clock cycle comprises two pulse widths: a wide pulse of width W1 and a narrow pulse of width W2. Waveform 158 corresponds to the output of DCC 110 in which the deterministic jitter has been substantially reduced. The output of DCC 110 can then be provided to clock buffer 122. As shown in waveform 160, the output of clock buffer 122 has a substantially zero phase delay with respect to input clock signal 112 (the phase delay "d" added by clock buffer 122 has canceled out the phase delay "1-d" that was added by circuitry 108).

Various modifications to the disclosed embodiments will be readily apparent to those skilled in the art, and the general principles defined herein may be applied to other embodiments and applications without departing from the spirit and scope of the present disclosure. Some variations and modifications of the embodiments illustrated in reference to FIGS. 1A-1B are described below.

Figure 2:
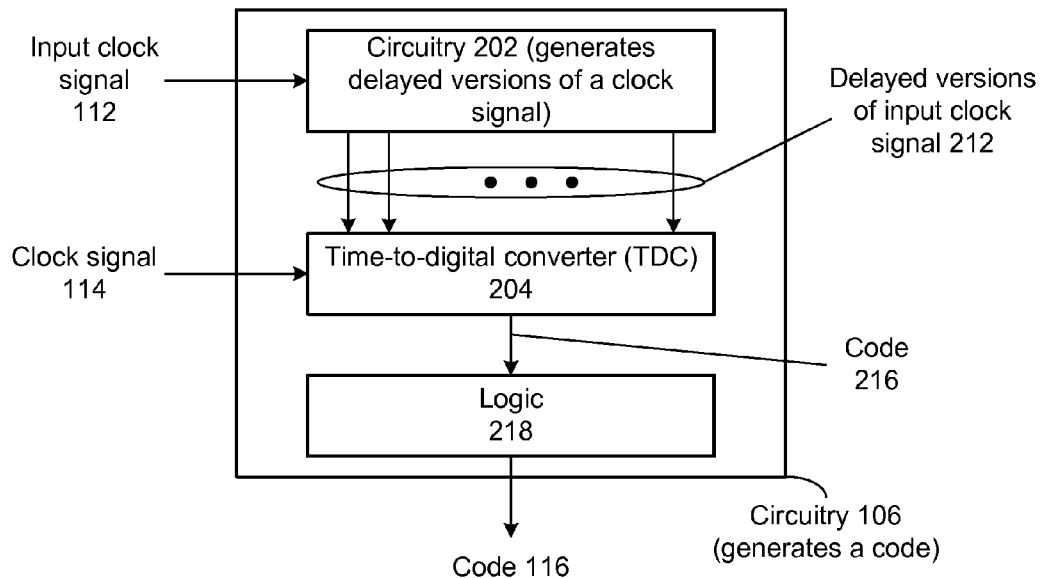
FIG. 2 illustrates circuitry to generate a code in accordance with some embodiments described herein.

FIG. 2 illustrates circuitry to generate a code in accordance with some embodiments described herein. Circuitry 106 includes circuitry 202 to generate delayed versions of a clock signal, and TDC 204.

According to one definition, a TDC includes circuitry that receives a sampling clock signal CK1, and delayed versions of clock signal CK2. The TDC then outputs a code that corresponds to a phase delay between the two signals (e.g., the phase delay of CK2 with respect to CK1). In some embodiments described herein, the TDC outputs a code at each positive (or negative) edge of the sampling clock signal CK1. In alternate embodiments, the TDC can issue a single sample, or multiple samples in accordance with a phase-capture request.

Input clock signal 112 is provided to circuitry 202 to generate delayed versions of input clock signal 112. These delayed versions are then provided to TDC 204 to produce code 216. TDC 204 uses clock signal 114 as the sampling clock signal. Code 216 is then provided to logic block 218, which generates code 116.

In some embodiments described herein, since the output of delay circuitry 104 (clock signal 114) is provided to TDC 204 as the sampling clock signal, code 116 corresponds to a phase delay of "1-d," where "d" is the phase delay that was added by delay circuitry 104. As a result, TDC 204 itself performs the conversion of the "d" phase delay into a "1-d" phase delay, and therefore no additional circuitry is required to perform this conversion. Therefore, the output of the TDC can be directly provided (e.g., without performing a "1-d" computation) to circuitry 108 for applying a delay based on code 116.

In some embodiments described herein, logic block 218 includes circuitry to reduce the sensitivity to jitter in input clock signal 112 and/or to reduce tracking bandwidth. In some embodiments described herein, logic block 218 can accomplish this by (a) taking multiple samples of code 216 and processing them (e.g., by averaging the samples or building a majority-detector from the incoming phase-stream) to produce an "up/down" or "early/late" indicator, which is then used to incrementally adjust the previously determined value of code 116, (b) limit the extent of the phase jump from the previously determined value of code 116, and/or (c) turn off triggered relock and only track at a reduce update rate.

Figure 3A:
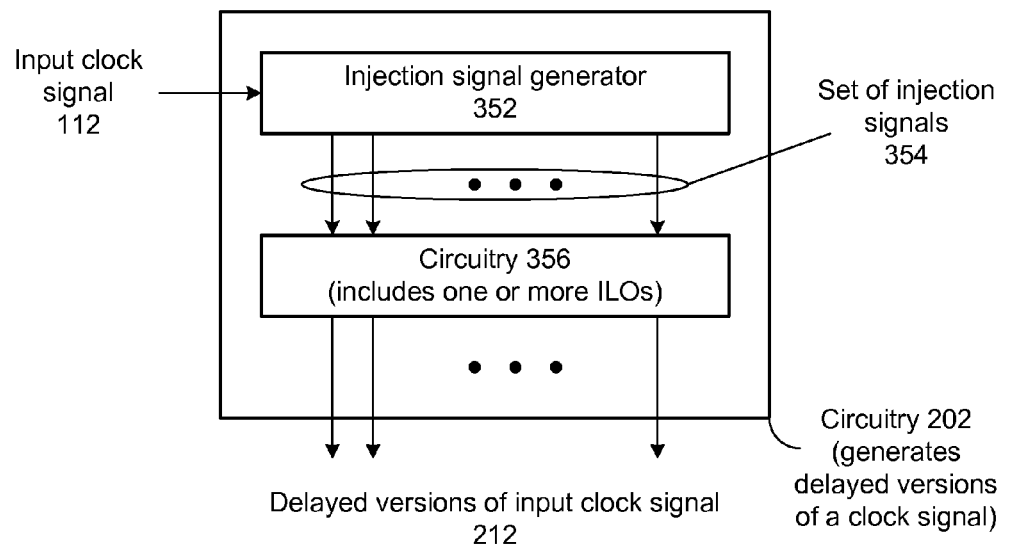
FIG. 3A illustrates an injection-locked oscillator (ILO)-based approach for generating delayed versions of a clock signal in accordance with some embodiments described herein.

FIGS. 3A-3I relate to some implementations of circuitry 202. These implementations are for illustration purposes only. Many modifications and variations will be apparent to those skilled in the art. FIG. 3A illustrates an ILO-based approach for generating delayed versions of a clock signal in accordance with some embodiments described herein.

In some embodiments described herein, circuitry 202 includes injection signal generator 352 and circuitry 356 that includes one or more ILOs. Injection signal generator 352 generates set of injection signals 354 based on input clock signal 112. Set of injection signals 354 are injected into one or more injection locations in circuitry 356. Set of injection signals 354 includes one or more injection signals. When set of injection signals 354 includes multiple injection signals, each injection signal has a different phase. When non-return-to-zero (NRZ) injection is used, each injection signal in set of injection signals 354 is an NRZ signal with a different phase. When pulse injection is used, each injection signal in set of injection signals 354 is a sequence of pulses with a different phase.

The low pass jitter transfer of an ILO attenuates duty cycle distortion error in the input clock signal 112, but may not completely correct the error. When NRZ injection is used, an ILO typically corrects up to a ±5% duty cycle distortion error in the input clock signal 112. When pulse injection is used, an ILO could correct up to ±30% duty cycle distortion error in the input clock signal 112. The output jitter tracks the input jitter better in NRZ injection than in pulse injection. In some embodiments, circuitry 202 can be switched between NRZ injection and pulse injection depending on the requirements, e.g., depending on whether better input jitter tracking is required or whether better duty cycle characteristics are required.

Figure 3B:
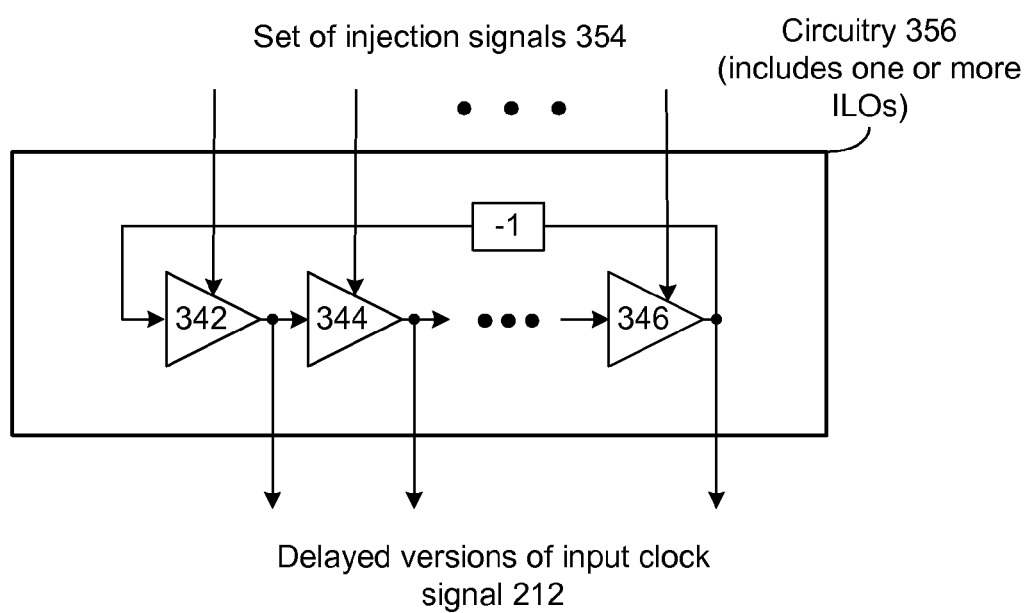
FIG. 3B illustrates circuitry to generate delayed versions of a clock signal that includes a single ILO in accordance with some embodiments described herein.

FIG. 3B illustrates an implementation of circuitry 356 that includes a single ILO in accordance with some embodiments described herein. An ILO includes multiple delay elements that are arranged in a loop. For example, the ILO shown in FIG. 3B includes delay elements 342-346 arranged in a loop. A delay element in the loop of an ILO may or may not invert its input signal. However, the connection of delay elements to form an oscillatory loop requires an effective inversion of the signal. The fact that the loop inverts the signal is illustrated in the figures of this disclosure by using a rectangular box with a "−1" written inside the box. The rectangular box may not correspond to an actual circuit element. In some embodiments, the rectangular box with a "−1" written inside the box represents the fact that the loop has an odd number of single-ended delay elements that invert the signal. In some embodiments, the rectangular box with a "−1" written inside the box represents the fact that the differential outputs of an odd number of differential delay elements are provided, with reverse polarity, to the next differential delay element in the loop. When circuitry 356 includes only one ILO (as shown in FIG. 3B), the outputs of the delay elements of the ILO are outputted as the delayed versions of input clock signal 212.

Figure 3C:
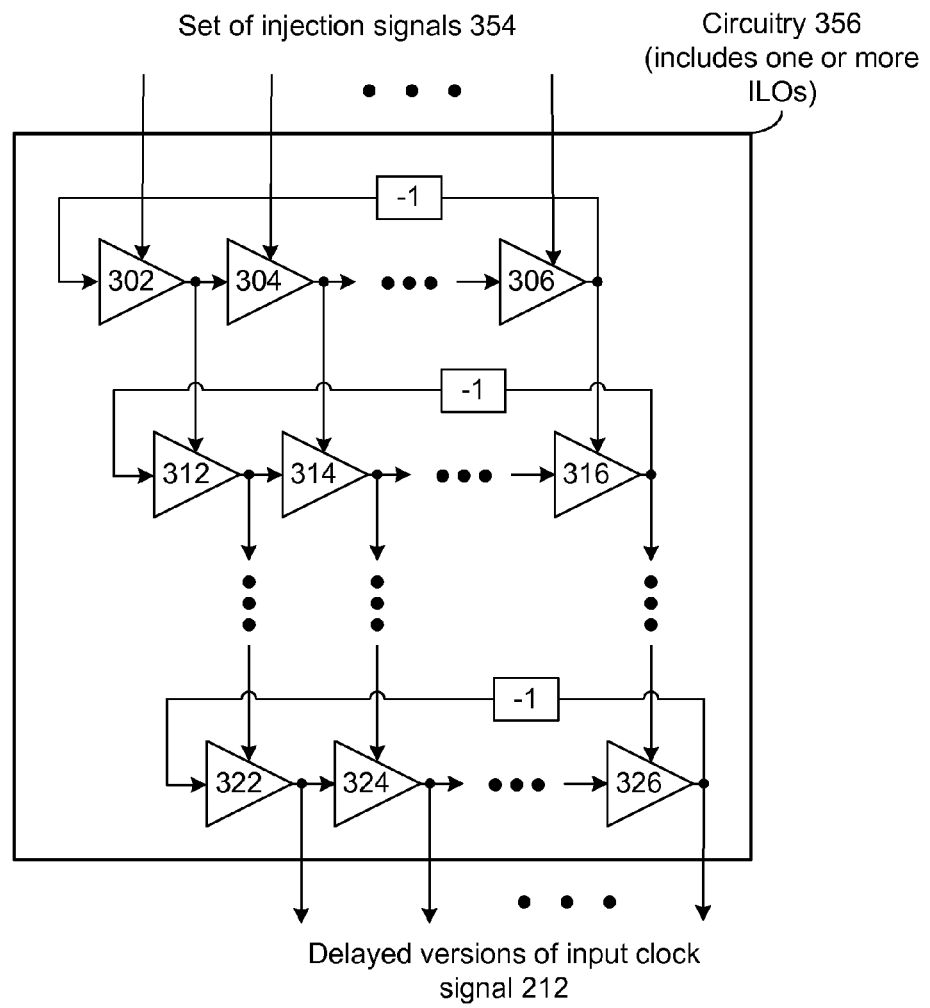
FIG. 3C illustrates circuitry to generate delayed versions of a clock signal that includes a cascaded-ILO structure in accordance with some embodiments described herein.

FIG. 3C illustrates an implementation of circuitry 356 that includes a cascaded-ILO structure in accordance with some embodiments described herein. The use of multiple ILOs in succession as shown can result in significantly reduced output jitter, even at the extreme of the locking range.

When circuitry 356 includes multiple ILOs (as shown in FIG. 3C), the outputs of the delay elements of each ILO are provided as injection signals (NRZ or pulse, depending on the requirements) to the corresponding delay elements in the next ILO, and the outputs of the delay elements of the last ILO are outputted as the delayed versions of the input clock signal 212. For example, as shown in FIG. 3C, the outputs of the delay elements 302-306 are provided as injection signals to corresponding delay elements 312-316, whose outputs are provided as injection signals to the corresponding delay elements of the next ILO, and so forth. The outputs of the delay elements 322-326 of the last ILO are outputted as delayed versions of input clock signal 212. In such cascaded-ILO structures, the appropriate correspondence is drawn to the delay-generation portion of code generation circuitry 106 by matching the individual blocks so that the delays match and track appropriately. The output clock signal of a cascaded-ILO structure has better jitter characteristics than the output clock signal of a single ILO due to the jitter filtering nature of multiple ILOs.

Figure 3D:
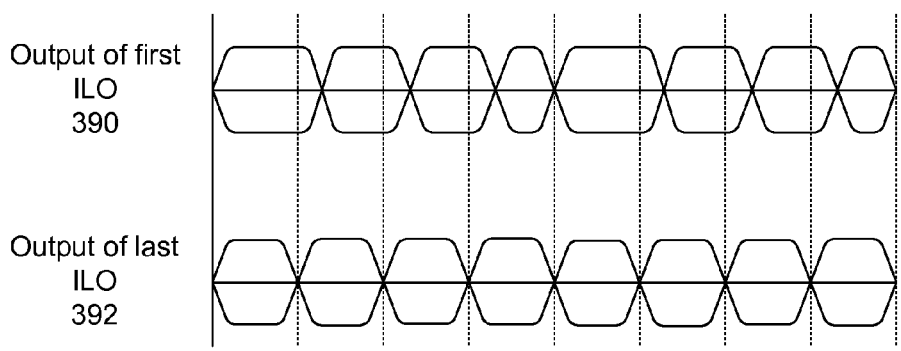
FIG. 3D illustrates waveforms that correspond to the first and last ILO in a cascaded-ILO structure in accordance with some embodiments described herein.

FIG. 3D illustrates waveforms that correspond to the first and last ILO in a cascaded-ILO structure in accordance with some embodiments described herein. Waveform 390 corresponds to the output of the first ILO. For example, waveform 390 may correspond to the output of delay element 302. Waveform 392 corresponds to the output of the last ILO. For example, waveform 392 may correspond to the output of delay element 322. The waveforms show that the output of the last ILO has better jitter characteristics than the output of the first ILO.

In some embodiments described herein, when the one or more ILOs in circuitry 356 are locked onto the input clock signal 112, the loop delay of each ILO is equal to one UI (unit interval). In other words, in some embodiments described herein, when the top ILO in FIG. 3B is locked onto input clock signal 112, the total delay from the input of delay element 302 to the output of delay element 306 is equal to the time difference between time instances T0 and T1 shown in FIG. 1B. Note that this property (i.e., the loop delay of each ILO is equal to one UI) is a direct result of the frequency-locking behavior of an ILO. Therefore, this property is expected to continue to hold as long as the one or more ILOs remain locked onto the input clock signal 112, regardless of any temperature and/or voltage changes that may occur during operation.

Figure 3E:
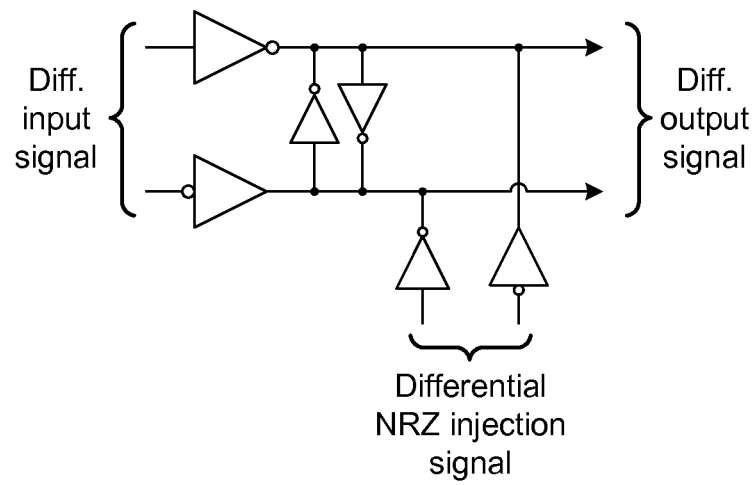
FIG. 3E illustrates a delay element of an ILO that uses non-return-to-zero (NRZ) injection in accordance with some embodiments described herein.

FIG. 3E illustrates a delay element of an ILO that uses NRZ injection in accordance with some embodiments described herein. The delay element illustrated in FIG. 3E can correspond to a delay element shown in FIG. 3B or FIG. 3C. As shown in FIG. 3E, the delay element can receive a differential input signal and a differential NRZ injection signal, and produce a differential output signal.

Figure 3F:
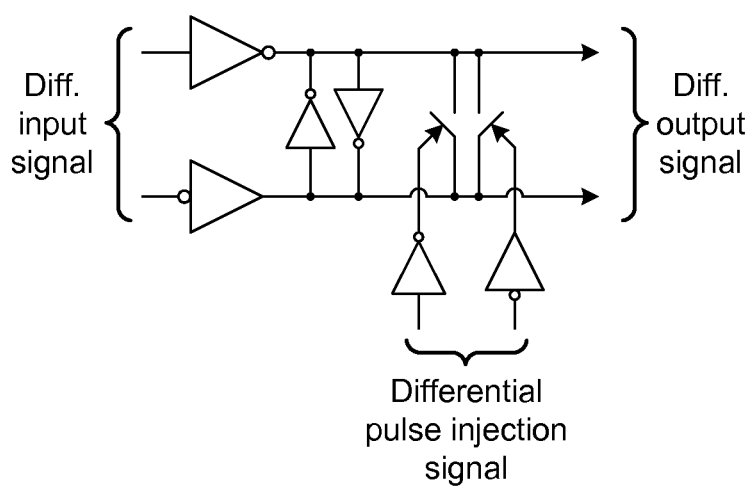
FIG. 3F illustrates a delay element of an ILO that uses pulse injection in accordance with some embodiments described herein.

FIG. 3F illustrates a delay element of an ILO that uses pulse injection in accordance with some embodiments described herein. The delay element illustrated in FIG. 3F can correspond to a delay element shown in FIG. 3B or FIG. 3C. As shown in FIG. 3D, the delay element can receive a differential input signal and a differential pulse injection signal, and produce a differential output signal.

Figure 3G:
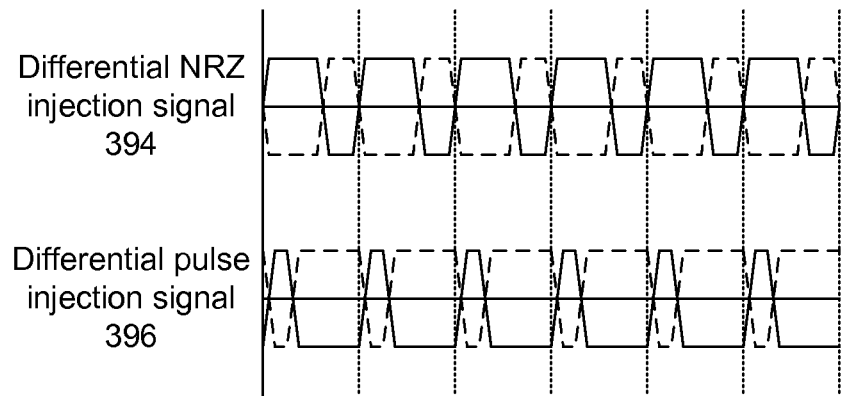
FIG. 3G illustrates waveforms that correspond to NRZ injection and pulse injection in accordance with some embodiments described herein.

FIG. 3G illustrates waveforms that correspond to NRZ injection and pulse injection in accordance with some embodiments described herein. The duty cycle distortion error of differential NRZ injection signal 394 corresponds to the duty cycle distortion error of the input signal. However, the duty cycle distortion error of the input signal does not affect differential pulse injection signal 396 because the pulses are separated by one clock cycle independent of the duty cycle distortion error of the input signal. The differential pulse injection signal 396 is generated based on either the rising edge or the falling edge of the input signal, but not both, to ensure that the timing of the pulses is independent of the duty cycle distortion of the input signal.

Figure 3H:
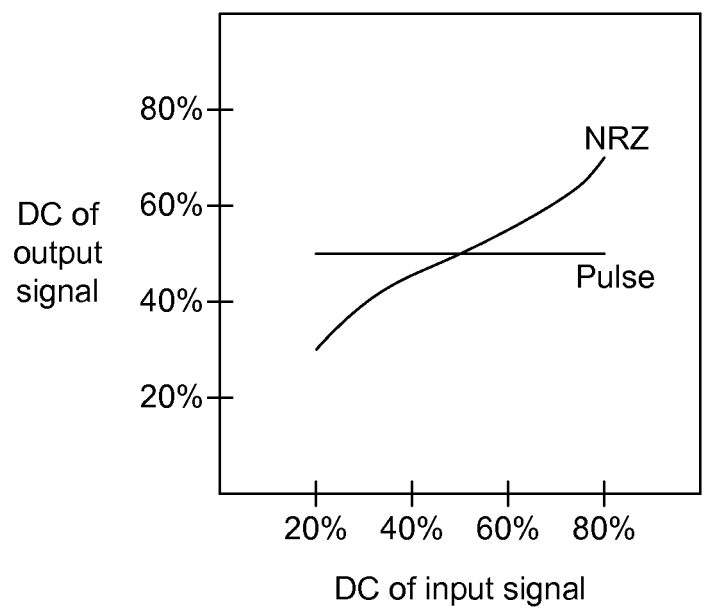
FIG. 3H illustrates plots of the duty cycle of the output signal versus the duty cycle of the input signal for NRZ and pulse injection in accordance with some embodiments described herein.

FIG. 3H illustrates plots of the duty cycle of the output signal versus the duty cycle of the input signal for NRZ and pulse injection in accordance with some embodiments described herein. As shown in FIG. 3H, for pulse injection, the duty cycle of the output signal remains substantially constant at 50% for a wide range of input duty cycles. On the other hand, for NRZ injection, the duty cycle of the output signal varies with the duty cycle of the input signal.

Figure 3I:
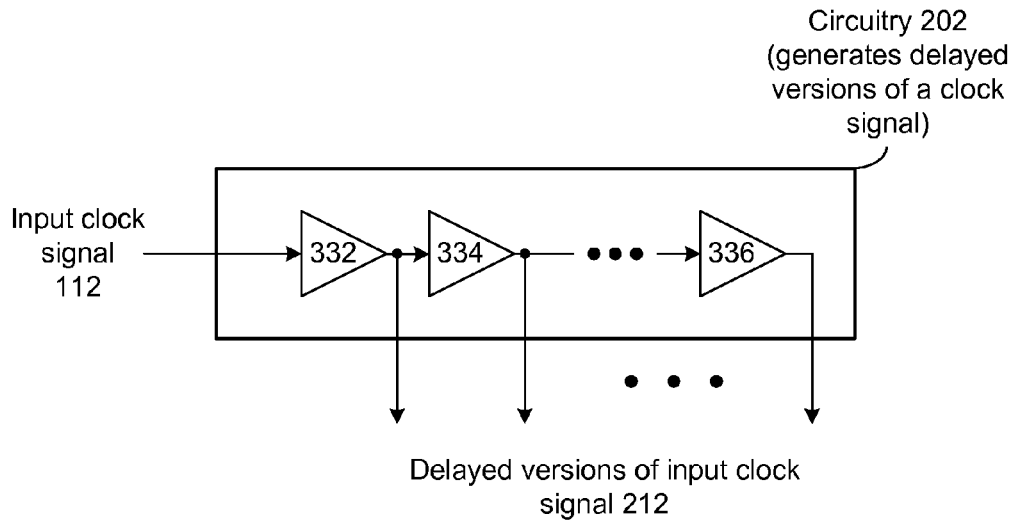
FIG. 3I illustrates a delay-chain-based approach for generating delayed versions of a clock signal in accordance with some embodiments described herein.

FIG. 3I illustrates a delay-chain-based approach for generating delayed versions of a clock signal in accordance with some embodiments described herein. In some embodiments described herein, circuitry 202 includes a delay chain comprising delay elements 332-336. In some embodiments described herein, the input clock signal is provided as an input to the first delay element in the delay chain, namely, delay element 332. The outputs of the delay elements are used as the delayed versions of input clock signal 212. Unlike the ILO-based approaches described in FIGS. 3B-3C, the total delay of the delay chain shown in FIG. 3I may not remain equal to one UI. Specifically, the delays of the delay elements (and therefore the total delay of the delay chain) may change when the voltage and/or temperature changes. Therefore, in delay-chain-based embodiments, the total delay of the delay chain is typically designed to be greater than one UI to ensure that the total delay of the delay chain will always be at least one UI. In these embodiments, additional circuitry is used to account for the change in the total delay, so that code 116 will still correspond to a "1-d" phase delay. Typically this is achieved with more complex logic inside code-conversion logic 218.

Figure 4:
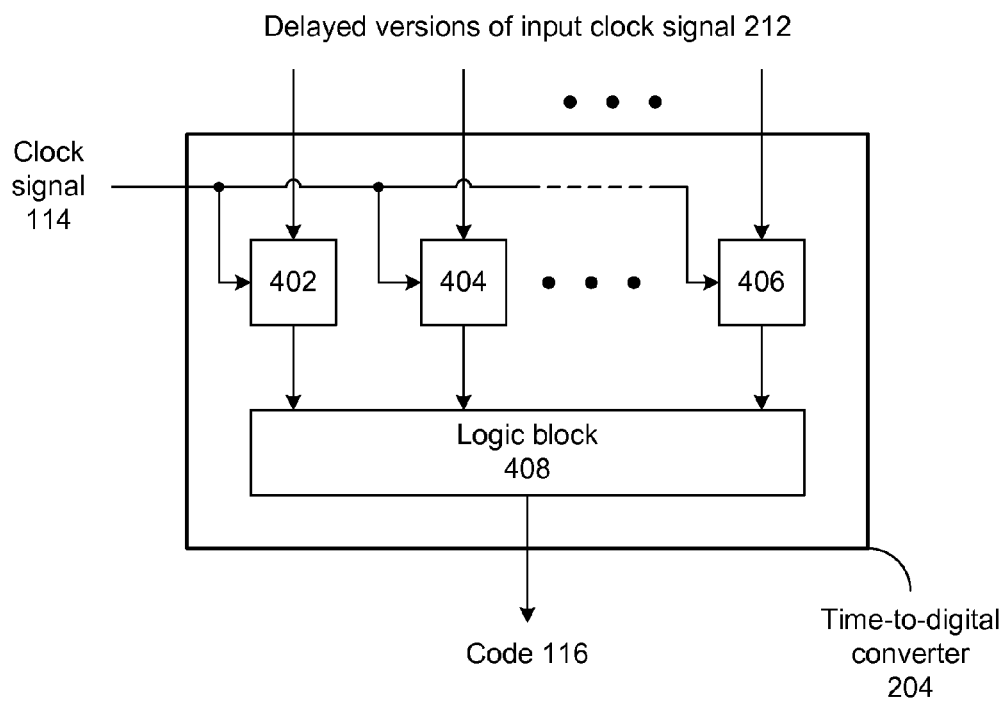
FIG. 4 illustrates a time-to-digital converter (TDC) in accordance with some embodiments described herein.

FIG. 4 illustrates a time-to-digital converter (TDC) in accordance with some embodiments described herein. In some embodiments described herein, TDC 204 includes samplers 402-406 and logic block 408. Each sampler receives a delayed version of input clock signal 212. Each sampler is triggered by a positive (or negative) edge of clock signal 114, i.e., the sampler performs the 1-bit analog-to-digital conversion at every positive (or negative) edge of clock signal 114.

The outputs from the samplers 402-406 are provided as inputs to logic block 408 which outputs code 116. Logic block 408 determines the phase delay of input clock signal 212 with respect to clock signal 114 by determining the location of two successive samplers that output different values (e.g., the $n^{th}$ sampler outputs a "0" and the $(n+1)^{th}$ sampler outputs a "1"). Logic block 408 then outputs code 116 that corresponds to the determined phase delay.

The resolution of the TDC shown in FIG. 4 is limited by the number of delayed versions of input clock signals 212 that are generated by circuitry 202. Increasing the number of delayed versions that are generated by circuitry 202 (e.g., by increasing the number of delay elements in the ILO) can increase the resolution, but it can also proportionately increase the power consumption of circuitry 202.

Figure 5A:
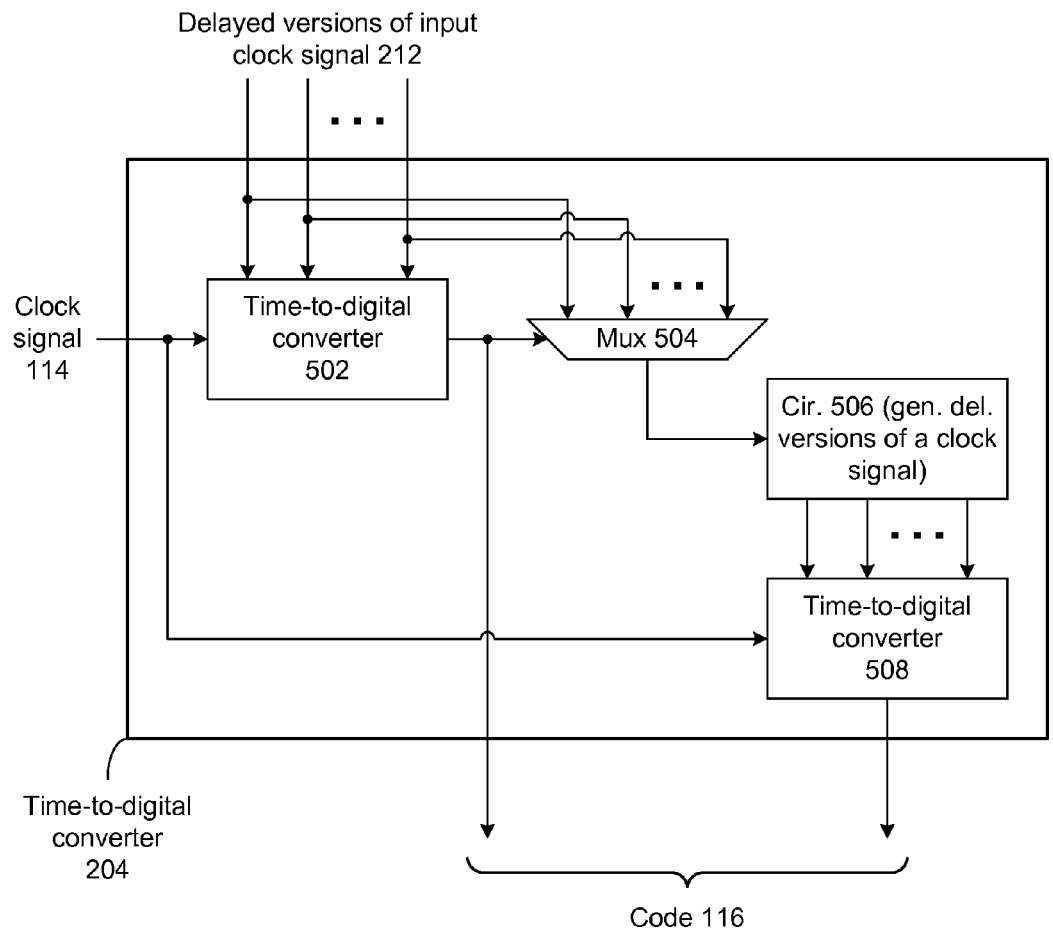
FIGS. 5A and 5B illustrate different approaches to increase the resolution of a TDC without proportionately increasing the power consumption in accordance with some embodiments described herein.
Figure 5B:
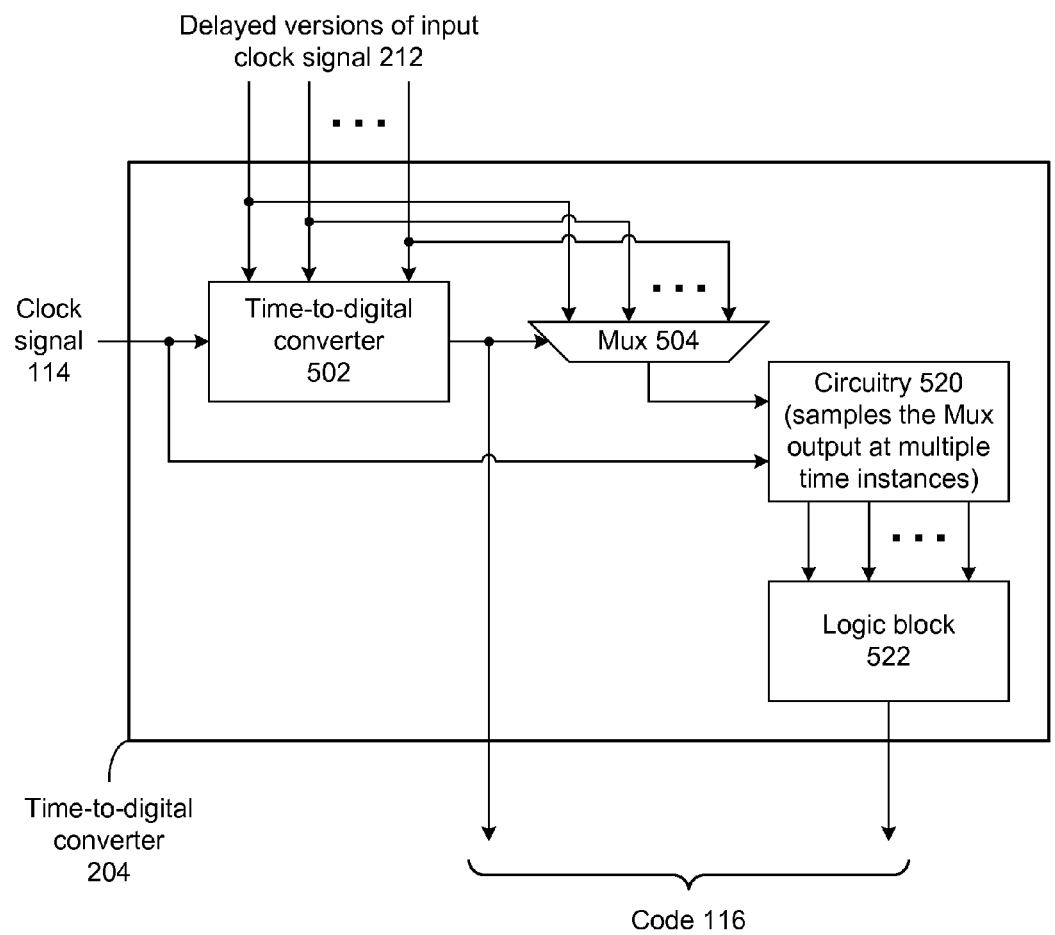

FIGS. 5A and 5B illustrate different approaches to increase the resolution of a TDC without proportionately increasing the power consumption in accordance with some embodiments described herein.

FIG. 5A illustrates an approach to increase the resolution of a TDC in accordance with some embodiments described herein. In some embodiments TDC 204 includes two TDCs: TDC 502 and TDC 508. TDC 502 determines the phase delay at a relatively coarser granularity, and TDC 508 determines the phase delay at a relatively finer granularity. In some embodiments this technique can be repeated, resulting in even finer granularity.

Delayed versions of input clock signal 212 are provided as inputs to TDC 502 and also as inputs to multiplexer 504. The code outputted by TDC 502 is provided as a select input to multiplexer 504, and is also provided as a first component of code 116. The code outputted by TDC 502 causes multiplexer 504 to select the delayed version of input clock signal 212 that has a small negative phase delay with respect to clock signal 114 (e.g., the edge of the output of multiplexer 504 occurs just before a corresponding edge of clock signal 114).

The output from multiplexer 504 is provided to circuitry 506 to generate delayed versions of the output of multiplexer 504. The delay elements used in circuitry 506 have a smaller delay (e.g., $¼^{th}$) than the delay of the delay elements (e.g., delay elements 302-306 shown in FIG. 3A) used in circuitry 202.

The outputs from circuitry 506 (i.e., the delayed versions of the output of multiplexer 504) are provided as inputs to TDC 508. TDC 508 produces a second component of code 116 based on clock signal 114 and the delayed versions of the output of multiplexer 504. In embodiments where this approach is repeated multiple times, more than two components of the code are generated, each successive component corresponding to an increasingly finer granularity of phase delay.

FIG. 5B illustrates another approach to increase the resolution of a TDC in accordance with some embodiments described herein. In FIG. 5B, the circuitry up to the output of multiplexer 504 is essentially the same as FIG. 5A, i.e., the output of multiplexer 504 is a delayed version of input clock signal 212 that has a small negative phase delay with respect to clock signal 114 (e.g., the edge of the output of multiplexer 504 occurs just before a corresponding edge of clock signal 114). The first component of code 116 in FIG. 5B is generated in essentially the same way as it was generated in FIG. 5A.

In the embodiment shown in FIG. 5B, the output of multiplexer 504 is provided as an input to circuitry 520 that samples the output of multiplexer 504 at multiple time instances. Circuitry 520 can use clock signal 114 as a trigger for generating the samples, e.g., when circuitry 520 detects a positive (or negative) edge in clock signal 114, circuitry 520 can sample the output of multiplexer 504 at multiple times instances to obtain a set of samples. The set of samples is provided as input to logic block 522. Logic block 522 uses the set of samples to determine the second component of code 116. In some embodiments this technique can be repeated, resulting in even finer granularity. In these embodiments, more than two components of the code are generated, each successive component corresponding to an increasingly finer granularity of phase delay.

In some embodiments described herein, logic block 522 includes circuitry to reduce the sensitivity to jitter in input clock signal 112 and/or to reduce tracking bandwidth. In some embodiments described herein, logic block 522 can accomplish this by (a) processing the output from circuitry 520 (e.g., by averaging the samples or building a majority-detector from the incoming phase-stream) to produce an "up/down" or "early/late" indicator, which is then used to incrementally adjust the previously determined value of code 116, (b) limit the extent of the phase jump from the previously determined value of code 116, and/or (c) turn off triggered relock and only track at a reduce update rate.

Figure 6:
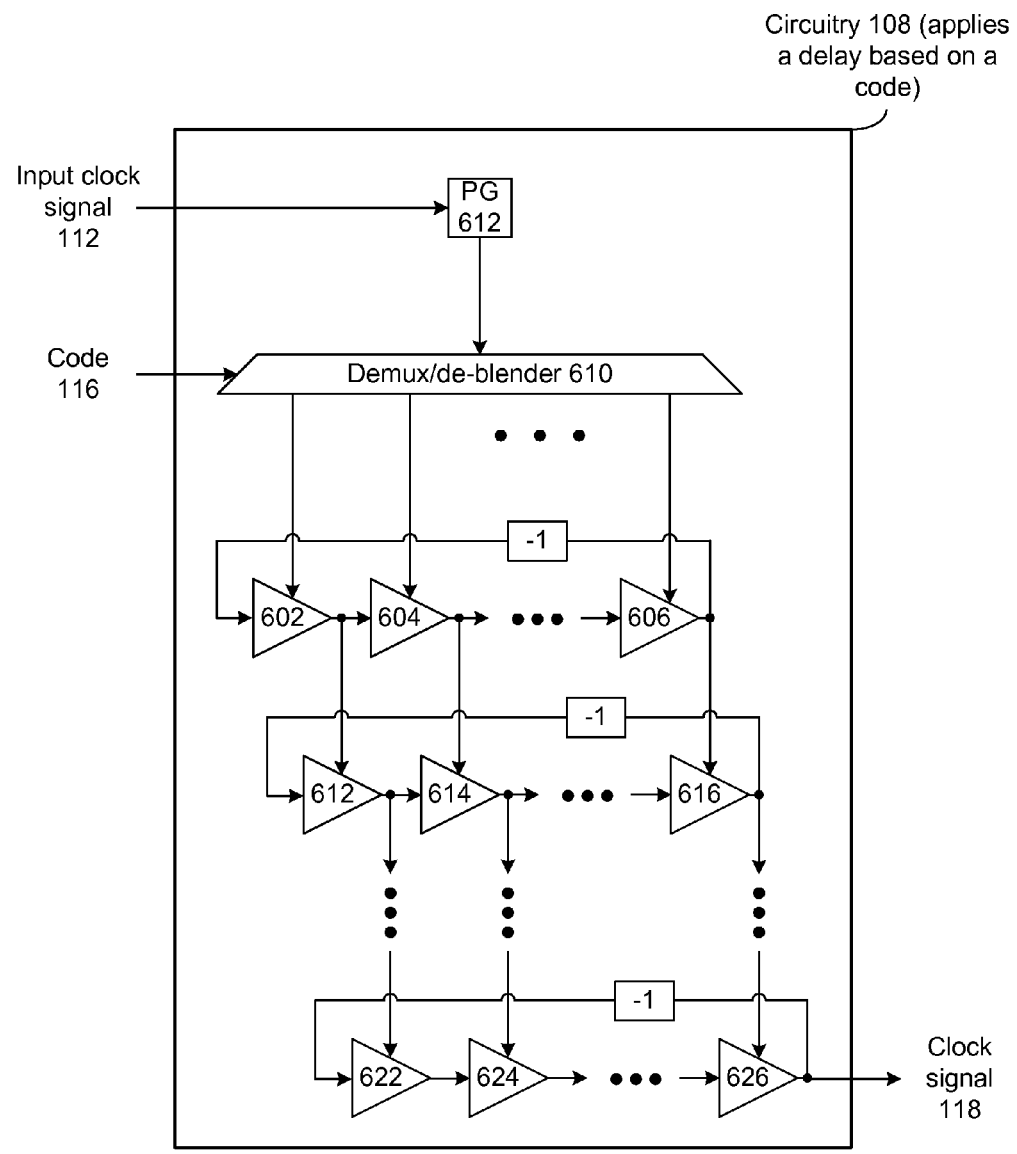
FIG. 6 illustrates an implementation of circuitry that applies a delay based on a code in accordance with some embodiments described herein.

FIG. 6 illustrates an implementation of circuitry 108 in accordance with some embodiments described herein. Circuitry 108 includes pulse generator 612, de-multiplexer/de-blender 610, and one or more ILOs. Input clock signal 112 is provided as an input to pulse generator 612, and the output of pulse generator 612 is provided as an input to de-multiplexer/de-blender 610.

According to one definition, the term "de-multiplexer/de-blender" generally refers to circuitry that is capable of providing an input signal on a selected output and/or providing an input signal with different weights (e.g., different amplitudes) on two or more selected outputs.

De-multiplexer/de-blender 610 can select the output(s) from the set of outputs and optionally determine the weights based on code 116. Specifically, if code 116 is generated by the embodiment of TDC 204 shown in FIG. 4, then de-multiplexer/de-blender 610 is configured to select a single output from the set of outputs. On the other hand, if code 116 is generated by the embodiments of TDC 204 shown in FIG. 5A or 5B, then de-multiplexer/de-blender 610 is configured to select two or more outputs from the set of outputs and also determine a weight for each selected output.

The outputs of de-multiplexer/de-blender 610 are provided as injection signals to corresponding delay elements 602-606 in the top ILO shown in FIG. 6. The phase delay of clock signal 118 with respect to input clock signal 112 depends on the output(s) and optionally the weights that were selected based on code 116. In this manner, circuitry 108 uses code 116 to apply a corresponding delay to input signal 112.

Circuitry 108 can include one or more ILOs. If circuitry 108 includes only one ILO, then one of the outputs (or a blended version of two or more outputs) of the delay elements of the ILO is outputted as clock signal 118. If circuitry 108 includes multiple ILOs, then the outputs of the delay elements of each ILO are provided as injection signals to the corresponding delay elements in the next ILO, and one of the outputs (or a blended version of two or more outputs) of the delay elements of the last ILO is outputted as clock signal 118. For example, as shown in FIG. 6, the outputs of the delay elements 602-606 are provided as injection signals to delay elements 612-616, whose outputs are provided as injection signals to the delay elements of the next ILO, and so forth. Output of delay element 626 in the last ILO is outputted as clock signal 118. The output clock signal of the cascaded ILO structure shown in FIG. 6 has better jitter characteristics than the output clock signal of a single ILO.

Note that the cascaded ILO structure has a deterministic phase delay between different ILOs. Therefore, de-multiplexer/de-blender 610 may need to account for this deterministic phase delay when de-multiplexer/de-blender 610 selects output(s) based on code 116.

In some embodiments, the natural frequency of the one or more ILOs in circuitry 356 (shown in FIG. 3B) substantially matches the natural frequency of the one or more ILOs in circuitry 108 (shown in FIG. 6). In some embodiments described herein, the ILOs in circuitry 108 can be replaced by multiplying ILOs (MILOs), i.e., the natural frequency of the one or more ILOs in circuitry 108 is an integral multiple or sub-multiple of the natural frequency of the one or more ILOs in circuitry 356. In these embodiments, the frequency of clock signal 118 can be an integral multiple or sub-multiple of the frequency of input clock signal 112. In this manner, circuit 102 can be used for performing clock de-skewing as well as integral clock multiplication or division.

Various modifications to the disclosed embodiments will be readily apparent to those skilled in the art, and the general principles defined herein may be applied to other embodiments and applications without departing from the spirit and scope of the present disclosure. Some variations and modifications of the circuitry shown in FIG. 1A are now discussed.

In some embodiments described herein, circuit 102 is used to achieve initial phase lock as explained above. However, after initial phase lock has been achieved (e.g., after an initial value for code 116 has been determined) delay circuitry 104 and circuitry 106 are transitioned to an operational state (e.g., a "sleep" state) that consumes less power than the operational state in which the initial phase lock was achieved. This can result in substantial power savings for the block. Note that the parallel structure of circuit 102 allows the power consumption to be reduced in this manner.

In some embodiments described herein, the clock buffer delay is substantially larger than the bit time (e.g., the period of the clock signal). For example, a clock buffer can be several nanoseconds, whereas the bit time may be a few hundred picoseconds. Since the clock buffer is significantly larger than the bit time, even a small variation in the delay of the clock buffer due to temperature and/or voltage changes can cause a significant mismatch in the phases of the clock buffer output signal and the input clock signal.

Therefore, in some embodiments, delay circuit 104 and circuitry 106 are periodically transitioned from the low power operating state (e.g., a "sleep" state) to the normal operating state (e.g., an "active" state) to reestablish phase lock. Once phase lock has been reestablished, delay circuit 104 and circuitry 106 are again transitioned back into the low power state. In some embodiments, in addition to periodically waking up delay circuit 104 and circuitry 106 to reestablish phase lock, these components are also woken up whenever a command (e.g., a "refresh" command) is received that requires circuit 102 to reestablish phase lock.

Figure 7:
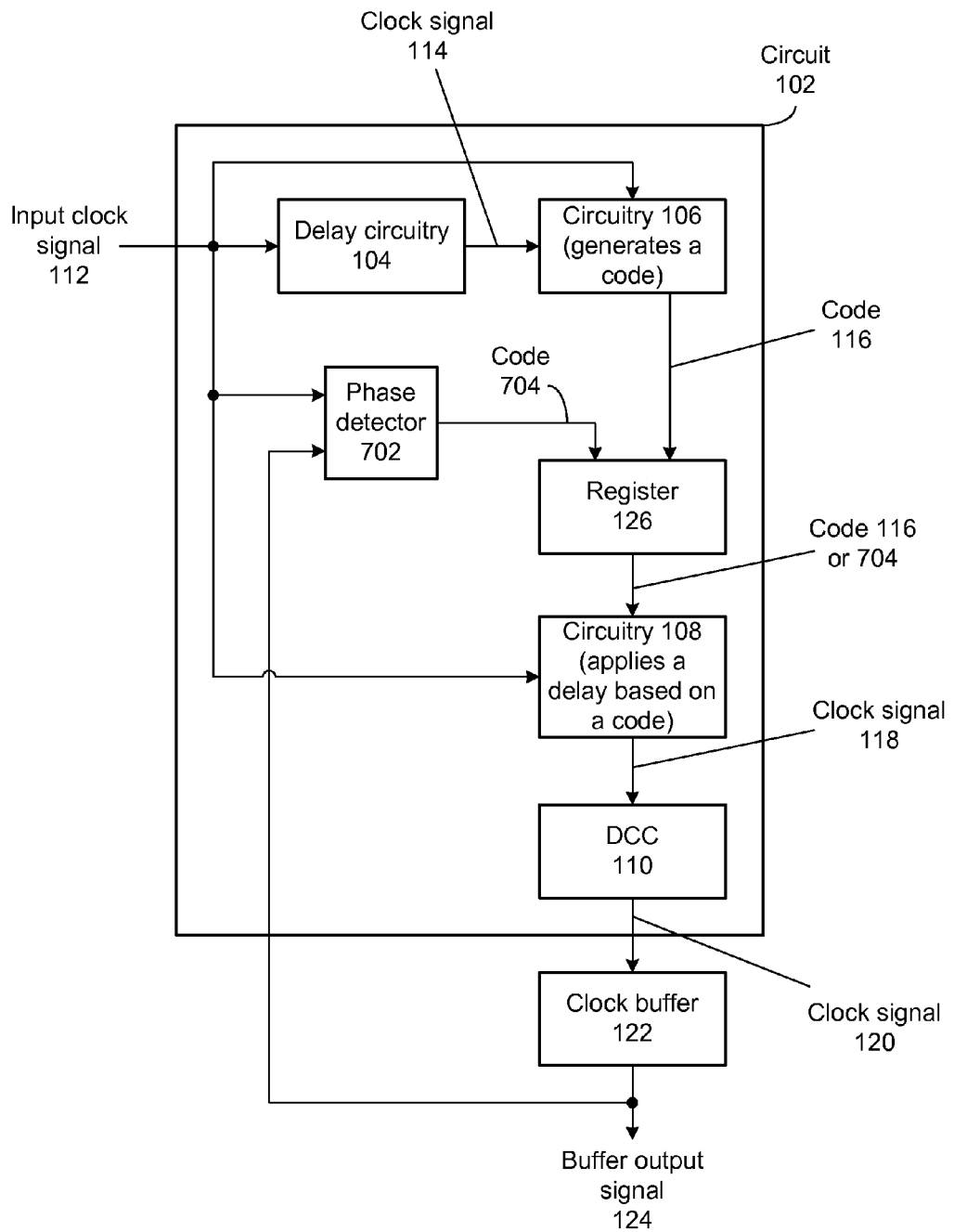
FIG. 7 illustrates a variation of the circuitry shown in FIG. 1A that uses a phase detector to continuously maintain phase lock in accordance with some embodiments described herein.

FIG. 7 illustrates a variation of the circuitry shown in FIG. 1A that uses a phase detector to continuously maintain phase lock in accordance with some embodiments described herein. The circuitry shown in FIG. 7 is essentially the same as the circuitry shown in FIG. 1A, except that the circuitry in FIG. 7 also includes phase detector 702. Phase detector 702 generates code 704, which is then stored in optional register 126 (if register 126 is present). Code 704 is then provided (either by register 126 or directly by phase detector 702) as an input to circuitry 108. During the initial phase lock, phase detector 702 is inactive (e.g., in an "off" or "sleep" state). In other words, during the initial phase lock, the circuitry shown in FIG. 7 operates in essentially the same way as the circuitry shown in FIG. 1.

However, once the initial phase lock has been achieved, the circuitry shown in FIG. 7 can (a) transition delay circuitry 104 and circuitry 106 to an operational state that consumes less power than the operational state that was used for achieving initial phase lock, and (b) activate phase detector 702.

Once activated, phase detector 702 outputs code 704 that corresponds to a phase delay of buffer output signal 124 with respect to input clock signal 112. Code 704 may have a different format (e.g., a different number of bits) than code 116. In some embodiments described herein, circuitry 108 uses code 704 to adjust the delay that circuitry 108 applies to input clock signal 112 so that a phase delay between input clock signal 112 and buffer output signal 124 remains constant. In this manner, phase detector 702 enables circuit 102 to continuously maintain phase lock even when operating conditions (e.g., operating voltage and/or temperature) change.

Figure 8:
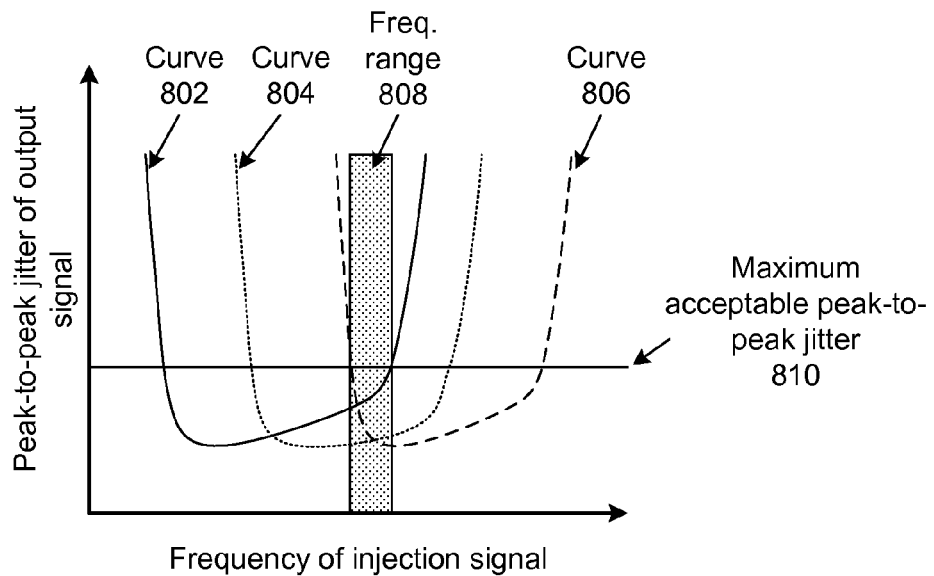
FIG. 8 illustrates a plot of the peak-to-peak jitter versus the injection signal frequency for an ILO or multiplying ILO (MILO) under different operating conditions in accordance with some embodiments described herein.

FIG. 8 illustrates a plot of the peak-to-peak jitter versus the injection signal frequency for an ILO or MILO under different operating conditions in accordance with some embodiments described herein.

According to one definition, when an ILO locks onto the injection signal, the ILO's output frequency is substantially equal to the injection signal frequency, and the peak-to-peak jitter of the ILO's output signal is less than a threshold. According to one definition, when the MILO locks onto the injection signal, the MILO's output frequency is substantially equal to an integral multiple or sub-multiple of the injection signal frequency, and the peak-to-peak jitter of the MILO's output signal is less than a threshold.

As shown in FIG. 8, the peak-to-peak jitter of the output signal can increase as the frequency of the injection signal moves further away from the natural frequency of the ILO or from an integral multiple or sub-multiple of the natural frequency of the MILO. If the frequency of the injection signal is too far away from the natural frequency of the ILO or from an integral multiple or sub-multiple of the natural frequency of the MILO, the ILO or MILO can lose its lock on the injection signal and start oscillating at a different frequency, often the natural frequency of the ILO or MILO. Since the natural frequency of the ILO or MILO can change with changing operating conditions, the locking behavior, and thus the plot of the peak-to-peak jitter versus injection signal frequency can be different for different operating conditions.

FIG. 8 illustrates curves 802, 804, and 806, which can correspond to the peak-to-peak jitter versus the injection signal frequency characteristic for different operating conditions, e.g., different combinations of supply voltages and temperatures. For example, curve 802 can correspond to a low supply voltage and high temperature, curve 804 can correspond to a nominal supply voltage and temperature, and curve 806 can correspond to a high supply voltage and low temperature.

In some embodiments described herein, the peak-to-peak jitter versus the injection signal frequency curves overlap (e.g., over frequency range 808 as shown in FIG. 8) for different operating conditions, thereby creating a frequency range over which the ILO or MILO locks onto the injection signal across a given set of operating conditions. Specifically, if the injection signal frequency is within frequency range 108, the output peak-to-peak jitter is less than or equal to the maximum acceptable peak-to-peak jitter 110. Therefore, the ILO or MILO does not need to be calibrated each time it is turned on, because, as long as the operating conditions are within the ranges shown in FIG. 8, the ILO or MILO will lock onto the injection signal.

In some embodiments described herein, the natural frequency of the ILO or MILO may be modified by adjusting the trim settings of the ILO or MILO. For example, the trim settings of the ILO or MILO can control the delay of each delay element in the delay loop, thereby changing the natural frequency of the ILO or MILO.

In some embodiments described herein, the first time the device is turned on, the device can adjust trim settings of the ILO or MILO so that the injection signal frequency is within the overlapping locking range (e.g., frequency range 108) of the ILO or MILO. In these embodiments, the trim settings in the ILO or MILO are adjusted to essentially account for process variations during manufacturing and for desired output frequency. However, after this initial adjustment, the ILO or MILO does not need to be calibrated even when operating conditions change if the injection signal frequency falls under the overlapping frequency range.

Figure 9:
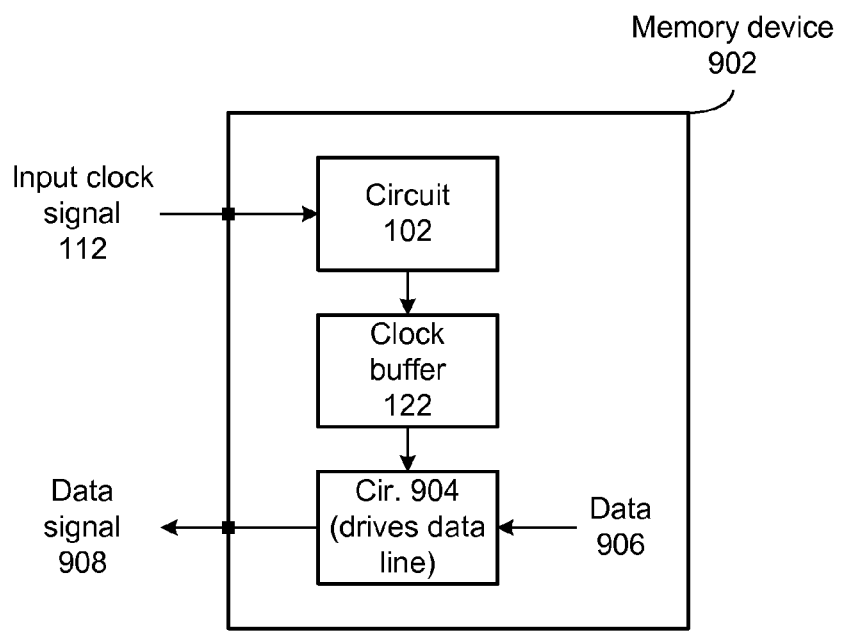
FIG. 9 illustrates a memory device in accordance with some embodiments described herein.

FIG. 9 illustrates a memory device in accordance with some embodiments described herein. In an embodiment, memory device 902 includes circuit 102, clock buffer 122, and circuitry 904 to drive a data line. Specifically, circuitry 904 can generate data signal 908 based on data 906 and output of clock buffer 122 (i.e., clock signal 120). Circuitry 904 can then drive a data line (which may be shared with other memory devices) using data signal 908.

In some embodiments described herein, an input clock signal may pass through one or more clock buffers as the input clock signal is distributed to the input/output (I/O) circuits of a memory device. In some embodiments described herein, it is desirable to synchronize the output of the one or more clock buffers with the input clock signal so that the edges of the data input/output signals of the I/O circuits are aligned with and track the edges of the input clock signal.

Figure 10:
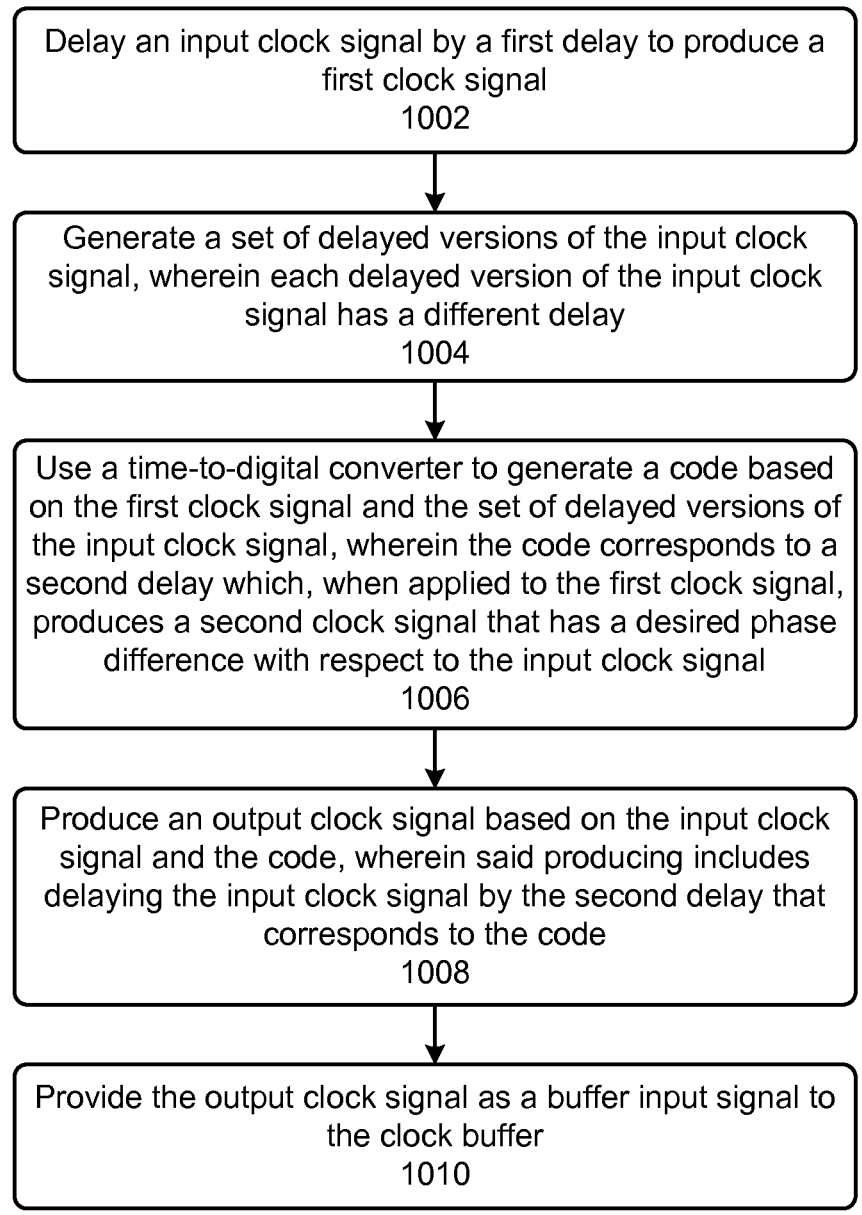
FIG. 10 presents a flow chart that illustrates a process for de-skewing a clock signal in accordance with some embodiments described herein.

FIG. 10 presents a flow chart that illustrates a process for de-skewing a clock signal in accordance with some embodiments described herein. In some embodiments described herein, an input clock signal is delayed by a first delay to produce a first clock signal (operation 1002). In some embodiments described herein, the first delay is substantially equal to a buffer delay of a clock buffer. A set of delayed versions of the input clock signal are then generated, wherein each delayed version of the input clock signal has a different delay (operation 1004). Specifically, one or more injection signals can be generated based on the input clock signal. Next, the one or more injection signals can be injected into one or more injection locations of an ILO. Output signals of the ILO can then be provided as the set of delayed versions of the input clock signal. A TDC can then be used to generate a code based on the first clock signal and the set of delayed versions of the input clock signal, wherein the code corresponds to a second delay which, when applied to the first clock signal, produces a second clock signal that has a desired phase difference with respect to the input clock signal (operation 1006). Next, an output clock signal is produced based on the input clock signal and the code, wherein said producing includes delaying the input clock signal by the second delay that corresponds to the code (operation 1008). Specifically, one or more injection signals can be generated based on the input clock signal. Next, the one or more injection signals can be injected into one or more injection locations of an ILO based on the code. An output signal of the ILO can then be provided as the output clock signal. The output clock signal is then provided as a buffer input signal to the clock buffer (operation 1010).

In some embodiments described herein, power consumption is reduced in a memory system by selectively activating and deactivating individual memory devices. Some embodiments described herein feature a memory device having DLL circuitry that can be used to de-skew a clock signal. The lock time of the DLL circuitry that is used in these embodiments is short, which enables these embodiment to save power by powering down at least some parts of the DLL circuitry for most of the time the device is active without incurring a performance hit. Specifically, in some embodiments, the DLL circuitry is activated for a short duration to allow the DLL circuitry to lock onto a clock signal, and then at least some parts of the DLL circuitry or the entire DLL circuitry is powered down for a longer duration. The length of the duration during which at least some parts of the DLL circuitry or the entire DLL circuitry is powered down depends on the amount of clock phase drift that can be tolerated in the memory system and the rate of the clock phase drift due to voltage and temperature variation.

In some embodiments, the memory device includes one or more output buffers that output one or more signals on one or more output pins that are coupled to one or more signal lines. The termination impedance of an output pin is adjusted depending on whether or not the memory device is active. Adjusting the termination impedance in this manner improves signal integrity by dampening reflections on the signal line that is coupled to the output pin.

A signal (hereinafter the "on-die-termination (ODT) signal"), is received by the memory device, and is used by the memory device to change the termination impedance of one or more output pins with precise timing. Some embodiments described herein include circuitry that is capable of changing the termination impedance with precise timing without suffering from a performance hit. The performance hit that is avoided is due to the latency required by the DLL circuitry to lock onto the reference clock signal (although the latency of the DLL circuitry is short, it can still impact performance because the timing constraints for the ODT signal can be extremely tight).

In some embodiments described herein, the clock skew between the CA clock and the DLL clock can be viewed as having two parts: an integral portion that is equal to an integral number of clock cycles of the CA clock, and a non-integral portion that is equal to a non-integral number of clock cycles of the CA clock. For example, if the clock skew between the CA clock and the DLL clock is equal to 2.7 clock cycles of the CA clock, then the integral portion can be equal to 2 and the non-integral portion can be equal to 0.7. In another example, a clock skew of 2.7 clock cycles can be split into an integral portion that is equal to 1, and a non-integral portion that is equal to 1.7. In some embodiments described herein, the integral portion is used to adjust the latency counter value, and the non-integral portion is applied to the ODT signal using the delay code that was generated by the DLL circuitry.

Figure 11A:
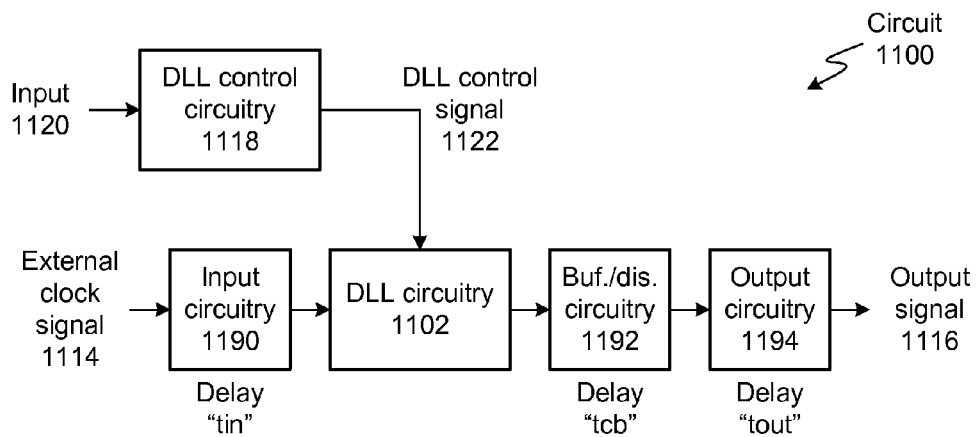
FIG. 11A illustrates a circuit in accordance with some embodiments described herein.

FIG. 11A illustrates a circuit in accordance with some embodiments described herein. Circuit 1100 is part of a memory device and includes DLL control circuitry 1118 that uses DLL control signal 1122 to control the operational state of DLL circuitry 1102. Different operational states of DLL circuitry 1102 have different power profiles.

Circuit 1100 includes input circuitry 1190 (which includes an input buffer), buffer and distribution circuitry 1192, and output circuitry 1194. The labels "tin," "tcb," and "tout" represent the delays experienced by external clock signal 1114 as it passes through circuitries 1190, 1192, and 1194, respectively.

In some embodiments described herein, DLL control circuitry 1118 uses one or more internal and/or external triggers to determine DLL control signal 1122. Input 1120 provides the external triggers to DLL control circuitry 1118. Input 1120 can generally include any information that is useful in determining if the operational state of DLL circuitry 1102 should be changed. For example, input 1120 can indicate if (1) a self refresh command has been received by the memory device, (2) a read command has been received by the memory device, (3) a change in temperature that is greater than a threshold was detected, (4) a drift in a clock signal that is greater than a threshold was detected, and/or (5) DLL circuitry 1102 has locked onto external clock signal 1114.

In some embodiments described herein, DLL control circuitry 1118 generates internal triggers to change the operational state of DLL circuitry 1102. For example, DLL control circuitry 1118 may generate an internal trigger based on a timer.

Figure 11B:
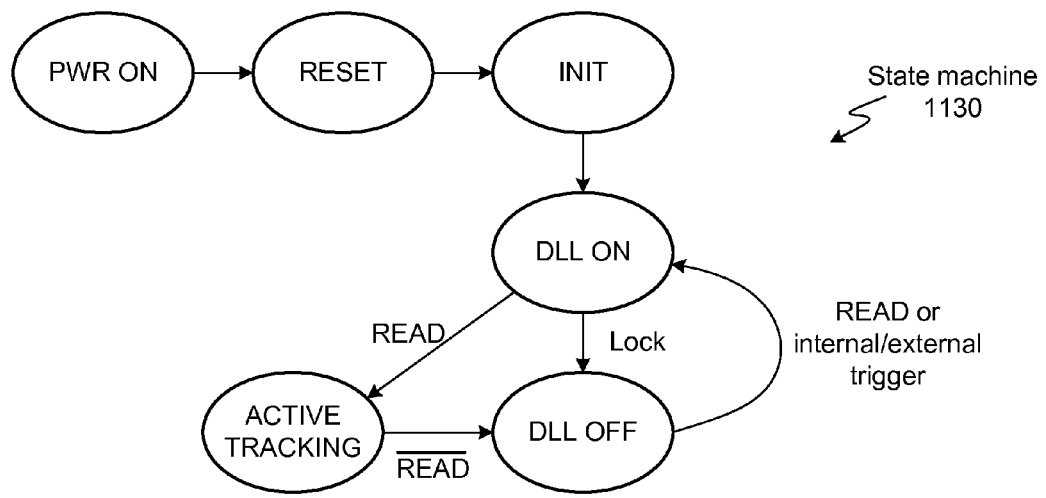
FIG. 11B illustrates a state machine that can be implemented by DLL control circuitry in accordance with some embodiments described herein.

FIG. 11B illustrates a state machine that can be implemented by DLL control circuitry 1118 in accordance with some embodiments described herein. In some embodiments described herein, DLL control circuitry 1118 can use state machine 1130 to generate DLL control signal 1122. Specifically, the states of state machine 1130 correspond to operational states of DLL circuitry 1102. As state machine 1130 enters or exits a state, DLL control circuitry 1118 can provide an appropriate DLL control signal 1122 to DLL circuitry 1102 so that DLL circuitry 1102 also correspondingly enters or exits an operational state.

State machine 1130 is in the PWR ON state when DLL circuitry 1102 is turned on. After DLL circuitry 1102 is turned on, state machine 1130 enters the RESET state in which DLL circuitry 1102 is reset to a predetermined starting state (e.g., counters may be cleared in this state). Next, state machine 1130 enters the INIT state in which DLL circuitry 1102 is initialized (e.g., calibration operations may be performed in this state). Once DLL circuitry 1102 has been initialized, state machine 1130 enters the DLL ON state in which DLL circuitry 1102 locks onto external clock signal 1114.

Once DLL circuitry 1102 locks, state machine 1130 enters the DLL OFF state in which at least some parts of DLL circuitry 1102 are powered down. In the DLL OFF state, DLL circuitry 1102 is not capable of tracking clock drift (e.g., clock drift that occurs due to voltage and temperature variations). If an internal or external trigger is received, and/or if a read command is received, state machine 1130 returns to the DLL ON state in which DLL circuitry 1102 reestablishes a lock on external clock signal 1114.

In some embodiments described herein, a timer is started when state machine 1130 enters the DLL OFF state. When the timer expires, an internal trigger is generated that causes state machine 1130 to enter the DLL ON state in which DLL circuitry 1102 reestablishes a lock on external clock signal 1114. The timer value can be programmable. In some embodiments described herein, the timer value is set so that a lock is reestablished on the clock signal before the clock signal drifts too far. In particular, the timer value can be programmed based on the amount of drift that is tolerated by the memory system and the rate of drift. The rate of drift may be predetermined, or it may be measured during operation.

Figure 11C:
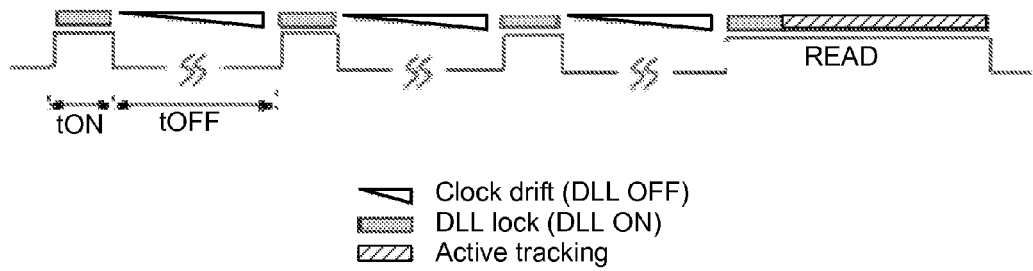
FIG. 11C illustrates an example of operating a DLL in different states according some embodiments described herein.

FIG. 11C illustrates an example of operating a DLL in different states according some embodiments described herein. As shown in FIG. 11C, the DLL is operated in an on/off pattern. The clock drifts while the DLL is off. Also as shown in FIG. 11C, if a read command is received, then the DLL is operated in the active tracing state after the DLL has locked onto the clock signal.

Figure 11D:
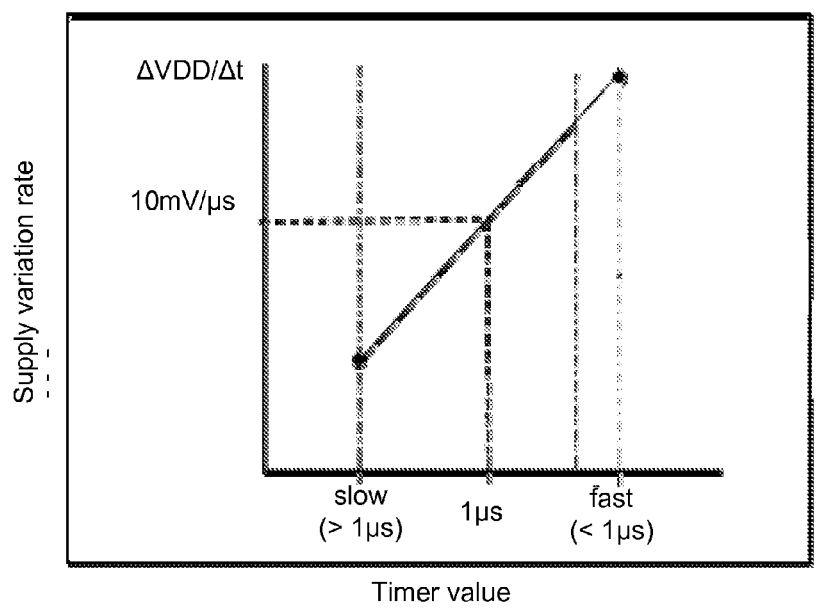
FIG. 11D illustrates a plot of supply variation rate and the timer value in accordance with some embodiments described herein.

FIG. 11D illustrates a plot of supply variation rate and the timer value in accordance with some embodiments described herein. In some embodiments described herein, variation in the supply voltage can cause clock drift. The X-axis shows the timer value that is used to trigger a transition to the DLL ON state, and the Y-axis shows the variation in supply voltage per unit time. As shown in FIG. 11D, the supply variation rate is inversely related to the timer value, i.e., a higher supply variation rate corresponds to a lower timer value (i.e., DLL circuitry 1102 needs to be transitioned into the DLL ON state more frequently), and a lower supply variation rate corresponds to a higher timer value (i.e., DLL circuitry 1102 needs to be transitioned into the DLL ON state less frequently). The power consumption of DLL circuitry 1102 is inversely related to the timer value, i.e., a lower timer value corresponds to higher power consumption, and a higher timer value corresponds to lower power consumption.

In some embodiments described herein, an external trigger is generated when (1) the memory device exits the self-refresh state (which was entered into when a self-refresh command was received by the memory device), (2) a change in temperature that is greater than a threshold is detected, and/or (3) a drift in a clock signal that is greater than a threshold is detected. The external trigger causes state machine 1130 to enter the DLL ON state in which DLL circuitry 102 reestablishes a lock on external clock signal 1114.

The above examples of internal and external triggers are for illustration purposes only and are not intended to limit the embodiments to the forms disclosed. Many variations and modifications will be apparent to those skilled in the art. In general, any set of events that is expected to cause the clock to drift by a sufficiently large amount can be used for generating an internal or external trigger.

If a read command is received by the memory device while state machine 1130 is in the DLL ON state, then state machine 1130 enters the ACTIVE TRACKING state in which some parts of DLL circuitry 1102 may be powered down. In the ACTIVE TRACKING state, DLL circuitry 1102 is capable of tracking clock drift (e.g., due to voltage and temperature changes). Therefore, in the ACTIVE TRACKING state, the data signal outputted by the memory device in response to the read command is precisely synchronized with external clock signal 1114 even in the presence of clock drift during the active period.

If a read command is received when state machine 1130 is in the DLL OFF state, then state machine 1130 enters the DLL ON state in which DLL circuitry 1102 reestablishes a lock on external clock signal 1114. Next, while the read operation is being performed, state machine 1130 enters the ACTIVE TRACKING state in which DLL circuitry 1102 tracks clock drift. Once the read command completes, state machine 1130 enters the DLL OFF state in which at least some parts of DLL circuitry 1102 are powered down.

In some embodiments described herein, the power consumption profile of DLL circuitry 1102 can be different in different states. Specifically, in some embodiments described herein, the power consumption profile is the highest in the DLL ON state, it is lower in the ACTIVE TRACKING state, and it is the lowest in the DLL OFF state.

Figure 11E:
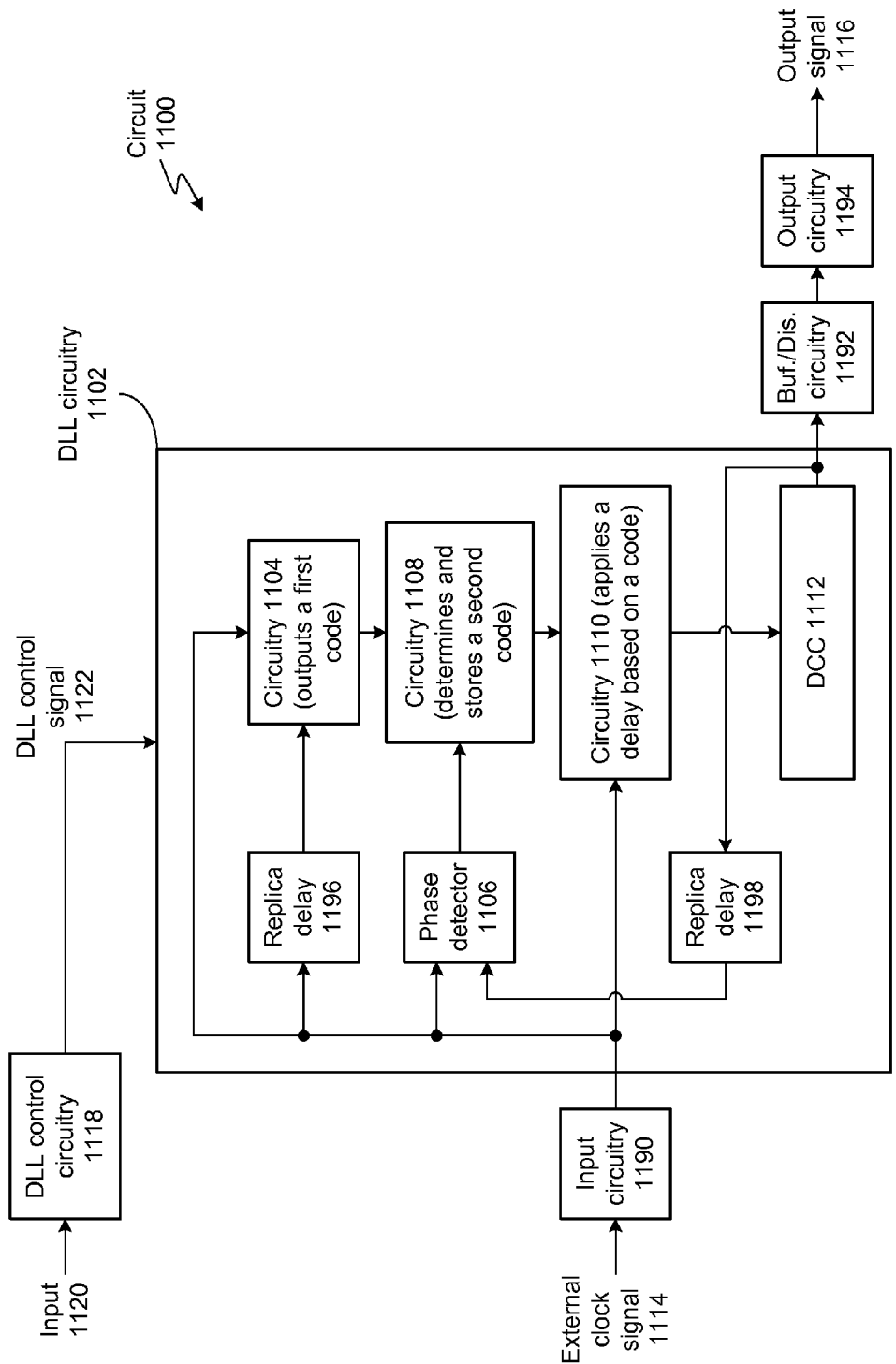
FIG. 11E illustrates an implementation of DLL circuitry in accordance with some embodiments described herein.

FIG. 11E illustrates an implementation of DLL circuitry 1102 in accordance with some embodiments described herein. In some embodiments described herein, the clock signal outputted by input circuitry 1190 is inputted to replica delay 1196. Replica delay 1196 then delays the clock signal by an amount that is equal to the sum of the delays "tin," "tcb," and "tout." Circuitry 1104 outputs a first code that represents a phase delay between the output of replica delay 196 and the output of input circuitry 1190.

The first code is provided to circuitry 1108 which determines a second code based on the first code, and stores the second code in a register. Circuitry 1108, inter alia, reduces the sensitivity to jitter in external clock signal 1114 or phase error in the feedback loop and/or reduces tracking bandwidth. In some embodiments described herein, circuitry 1108 accomplishes this by (a) taking multiple samples of the first code outputted by circuitry 1104 and processing them (e.g., by averaging the samples or building a majority-detector from the incoming phase-stream) to produce an "up/down" or "early/late" indicator, which is then used to incrementally adjust the previously determined value of the second code, (b) limit the extent of the phase jump from the previously determined value of the second code, and/or (c) turn off triggered relock and only track at a reduced update rate. Some implementations of circuitries 1104 and 1108 are explained below in reference to FIGS. 15A-15F and 16A-16C.

The second code corresponds to a delay which, when applied to the output of input circuitry 1190, causes output signal 1116 to have a phase delay with respect to external clock signal 1114 that is substantially equal to a desired phase delay. In this disclosure, the term "phase delay" refers to the fractional portion of the clock skew when measured in clock cycles. In some embodiments, the desired phase delay is equal to zero. When the desired phase delay is equal to zero, the following equation holds: $N \cdot tCK = tin + tout + tcb + tdelay$, wherein "N" is an integer, tCK is the clock period, and "tdelay" is the delay provided by circuitry 1110 (discussed below).

Figure 16A:
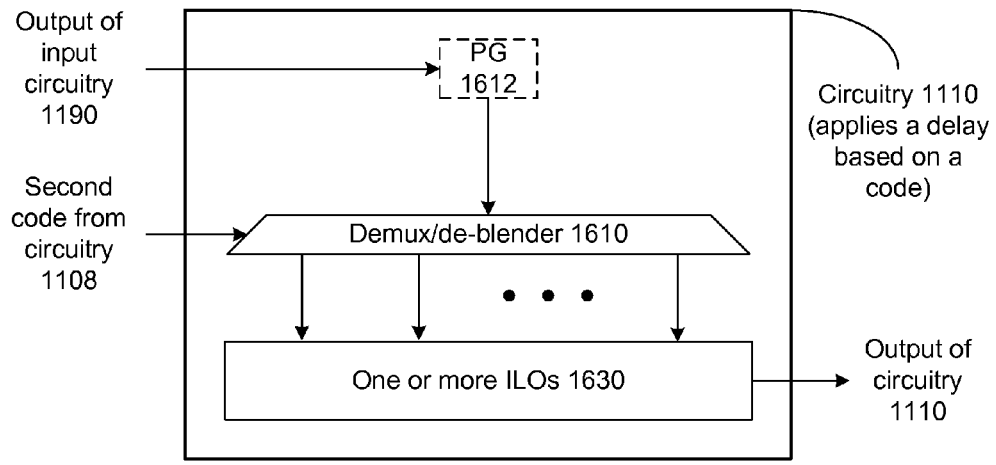
FIG. 16A illustrates an implementation of circuitry that applies a delay based on a code in accordance with some embodiments described herein.
Figure 16B:
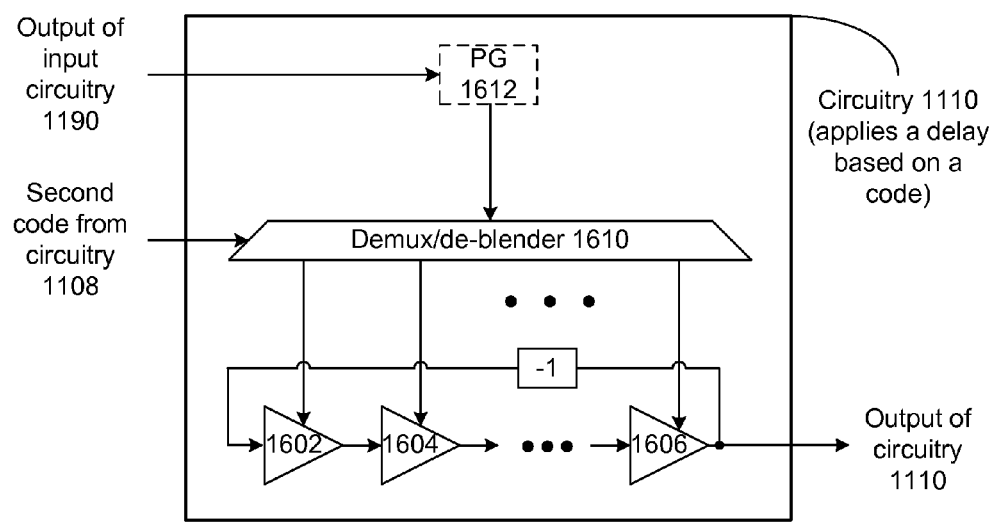
FIGS. 16B-16C illustrate different implementations of the circuitry shown in FIG. 6A in accordance with some embodiments described herein.
Figure 16C:
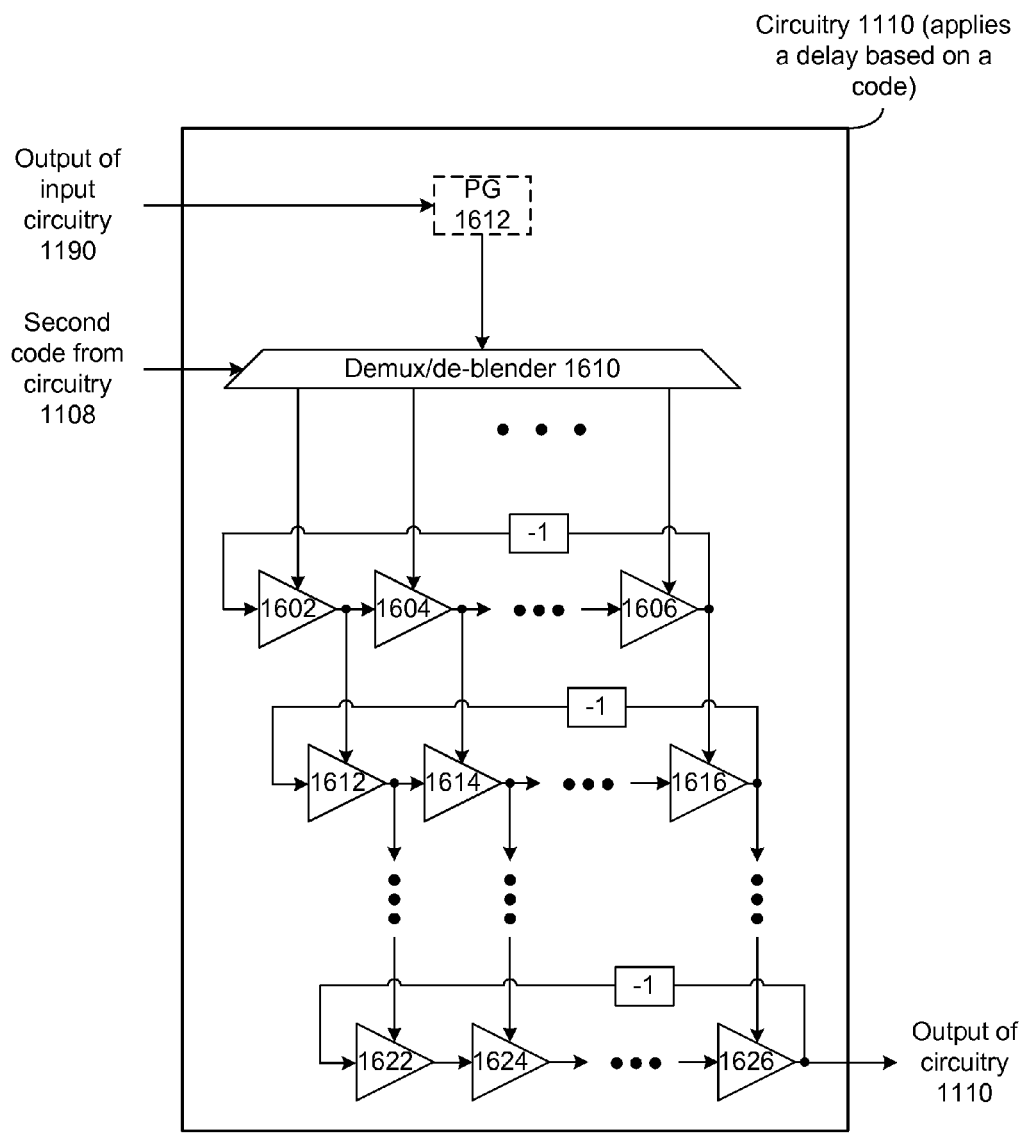

Circuitry 1110 applies a delay to the output of input circuitry 1190 that corresponds to the second code received from circuitry 1108. FIGS. 16A-16C explained below describe some implementations of circuitry 1110. The output of circuitry 1110 may contain deterministic jitter. In some embodiments described herein, duty cycle corrector (DCC) 1112 is used to substantially eliminate deterministic jitter by adjusting the pulse widths. When present, DCC 1112 produces an output signal whose high-pulse widths and low-pulse widths are substantially equal and constant. The output of DCC 1112 is provided to buffer and distribution circuitry 1192.

If the output of circuitry 1110 contains at most a negligible amount of deterministic jitter, DLL circuitry 1102 may not include DCC 1112, and the output of circuitry 1110 may be directly provided as input to buffer and distribution circuitry 1192.

Some implementations of DLL circuitry 1102 described herein use a parallel structure. Specifically, in DLL circuitry 1102, external clock signal 1114 is routed along the following parallel paths: a code generation path that includes replica delay 1196, circuitry 1104, and circuitry 1108, and a code application path that includes circuitry 1110.

Figure 11F:
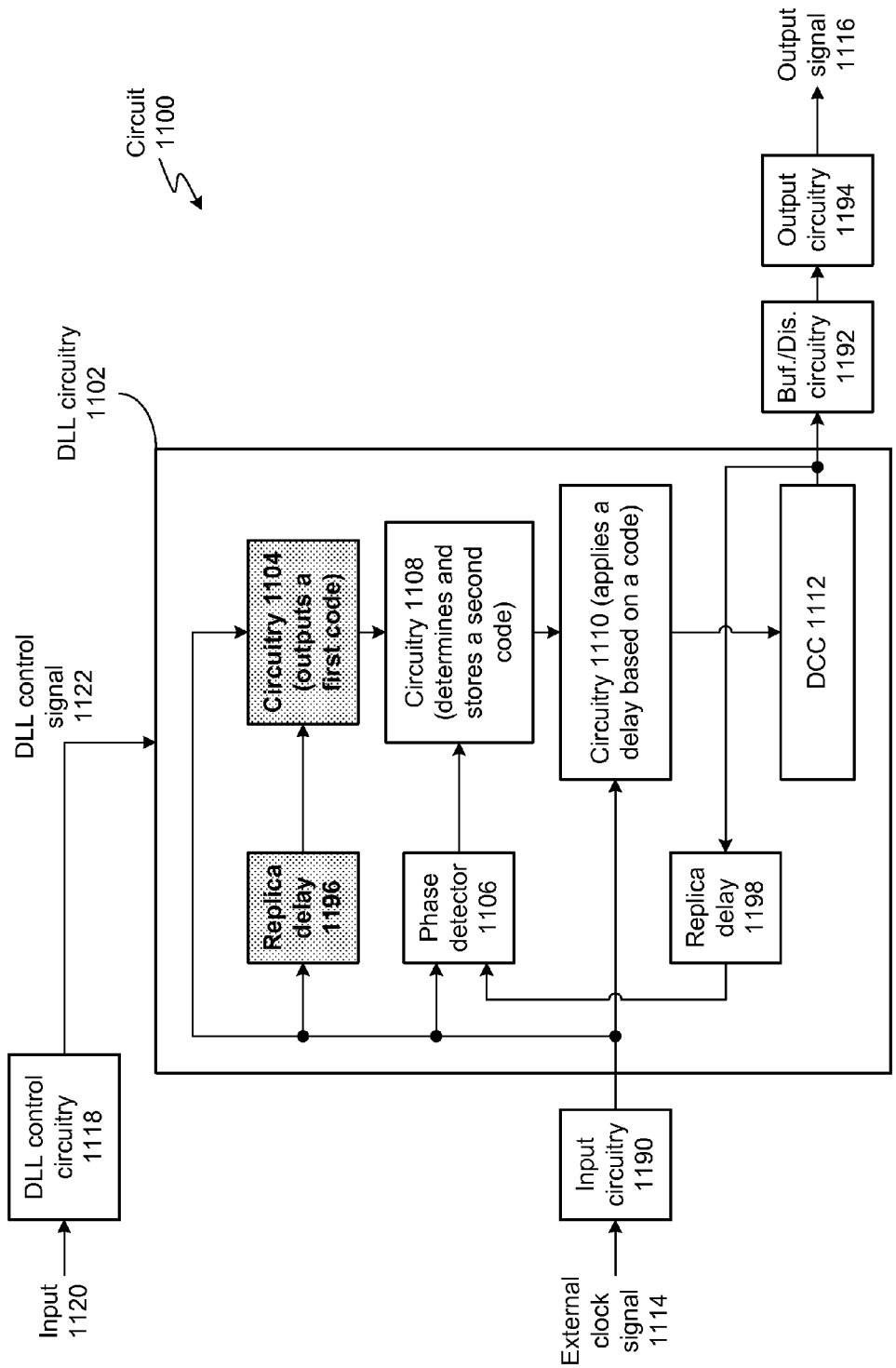
FIG. 11F illustrates an operational state of DLL circuitry in accordance with some embodiments described herein.

In some embodiments described herein, all circuit blocks in DLL circuitry 1102 shown in FIG. 11E are active in the DLL ON state. FIG. 11F illustrates an operational state of DLL circuitry 1102 in accordance with some embodiments described herein. The parts of DLL circuitry 1102 that are powered down during the ACTIVE TRACKING state are shaded in FIG. 11F. As shown in FIG. 11F, replica delay 1196 and circuitry 1104 are powered down in the ACTIVE TRACKING state. Phase detector 1106 provides a value to circuitry 1108 based on the phase difference between the output of input circuitry 1190 and the output of replica delay 1198. The delay of replica delay 1198 is equal to the sum of the delays "tin," "tcb," and "tout." Therefore, in the ACTIVE TRACKING state, the output of phase detector 1106 (and therefore the second code outputted by circuitry 1108) is capable of tracking the aggregate change in the delays "tin," "tcb," and "tout" that occur due to variations in voltage and/or temperature by providing updates (e.g., increment or decrement signals) to the phase code already stored in a register in circuitry 1108.

Figure 11G:
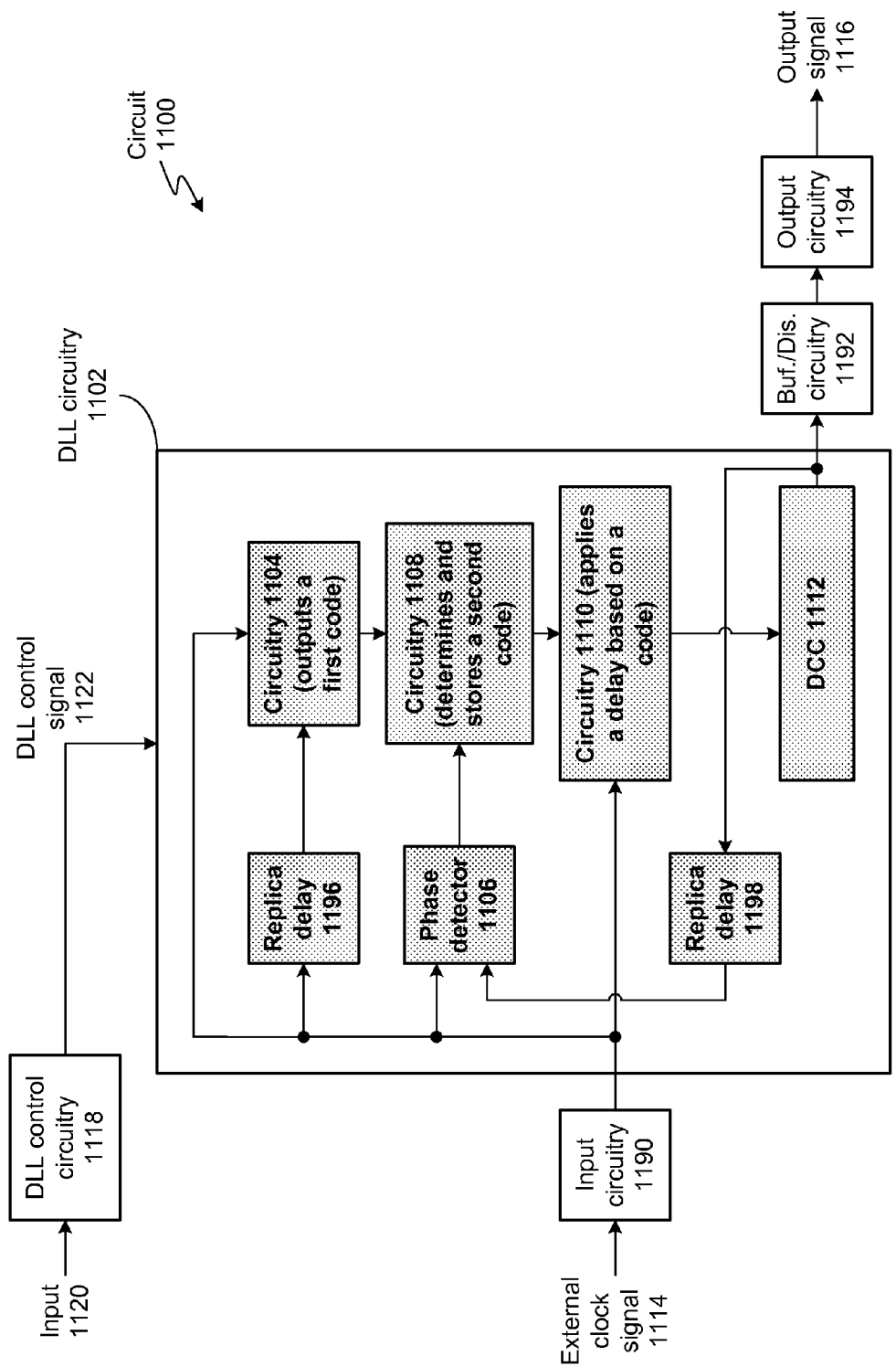
FIG. 11G illustrates an operational state of DLL circuitry in accordance with some embodiments described herein.

FIG. 11G illustrates an operational state of DLL circuitry 1102 in accordance with some embodiments described herein. The parts of DLL circuitry 1102 that are powered down during the DLL OFF state are shaded in FIG. 11G. As shown in FIG. 11G, all of the circuit blocks are powered down in the DLL OFF state. When DLL circuitry 1102 is transitioned from the DLL OFF state to the DLL ON state, circuitry 1110 immediately starts using the value of the second code that was previously stored in circuitry 1108. When DLL circuitry 1102 locks onto external clock signal 1114, circuitry 1108 may change the second code value, at which point circuitry 1110 starts using the new second code value.

Figure 11H:
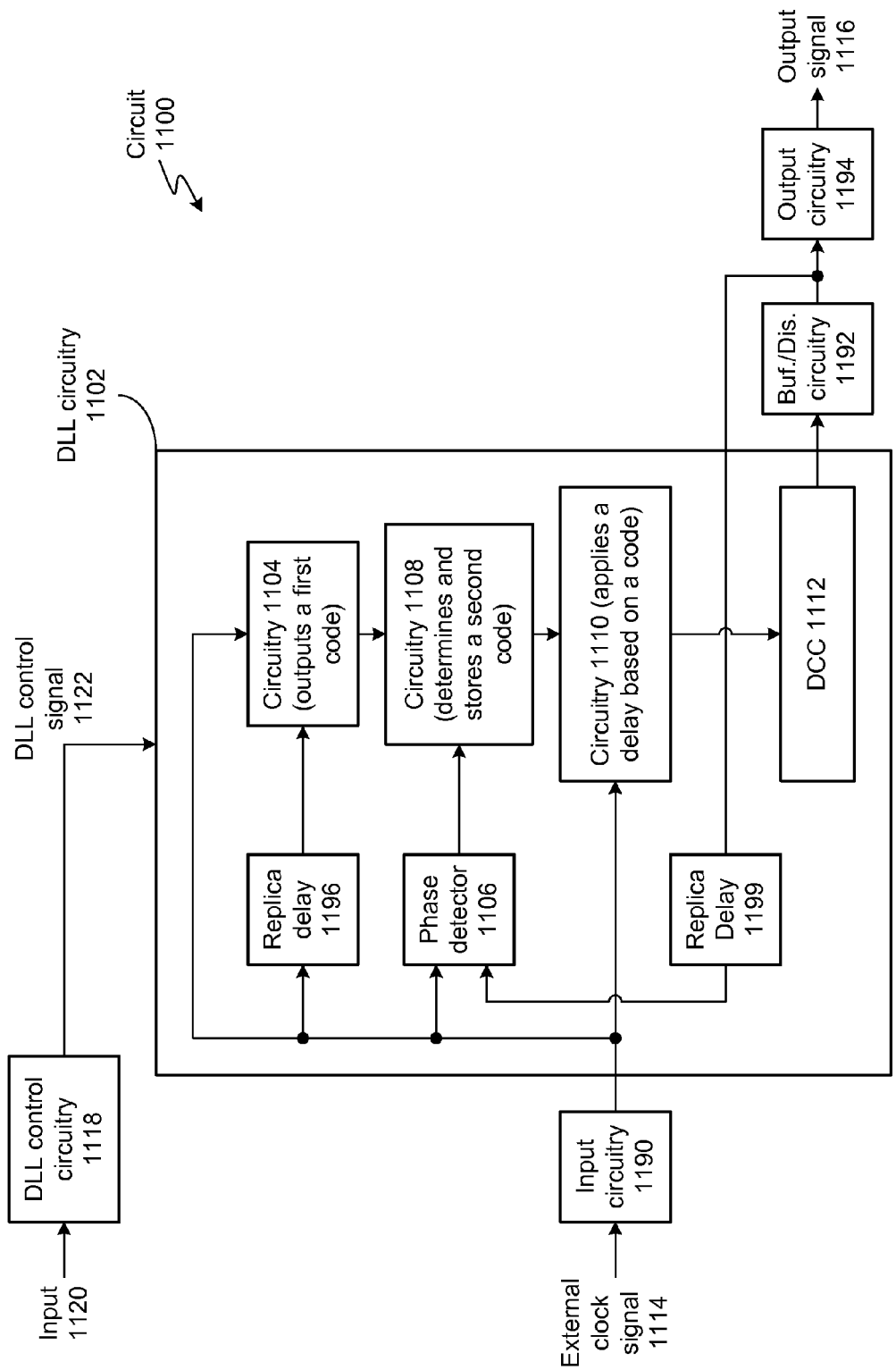
FIG. 11H illustrates a variation of the implementation shown in FIG. 11E in accordance with some embodiments described herein.

FIG. 11H illustrates a variation of the implementation shown in FIG. 11E in accordance with some embodiments described herein. In FIG. 11H, the output of buffer and distribution circuitry 1192 is provided as an input to replica delay 1199, and the output from replica delay 1199 is provided as an input to phase detector 1106. The delay of replica delay 1199 is equal to the sum of the delays "tin" and "tout." The implementation shown in FIG. 11H can potentially save more power than the implementation shown in FIG. 11E because replica delay 1199 is smaller than replica delay 1198. Further, the implementation shown in FIG. 11H can potentially be more accurate than the implementation shown in FIG. 11E because the implementation shown in FIG. 11H uses the actual buffer and distribution circuitry 1192 instead of circuitry in replica delay 1198 that matches the delay of buffer and distribution circuitry 1192. In the embodiment shown in FIG. 11H, care must be taken that the phase detector output or the update loop is disabled when the output clock is also disabled in order to avoid false updates to the phase position.

Figure 12:
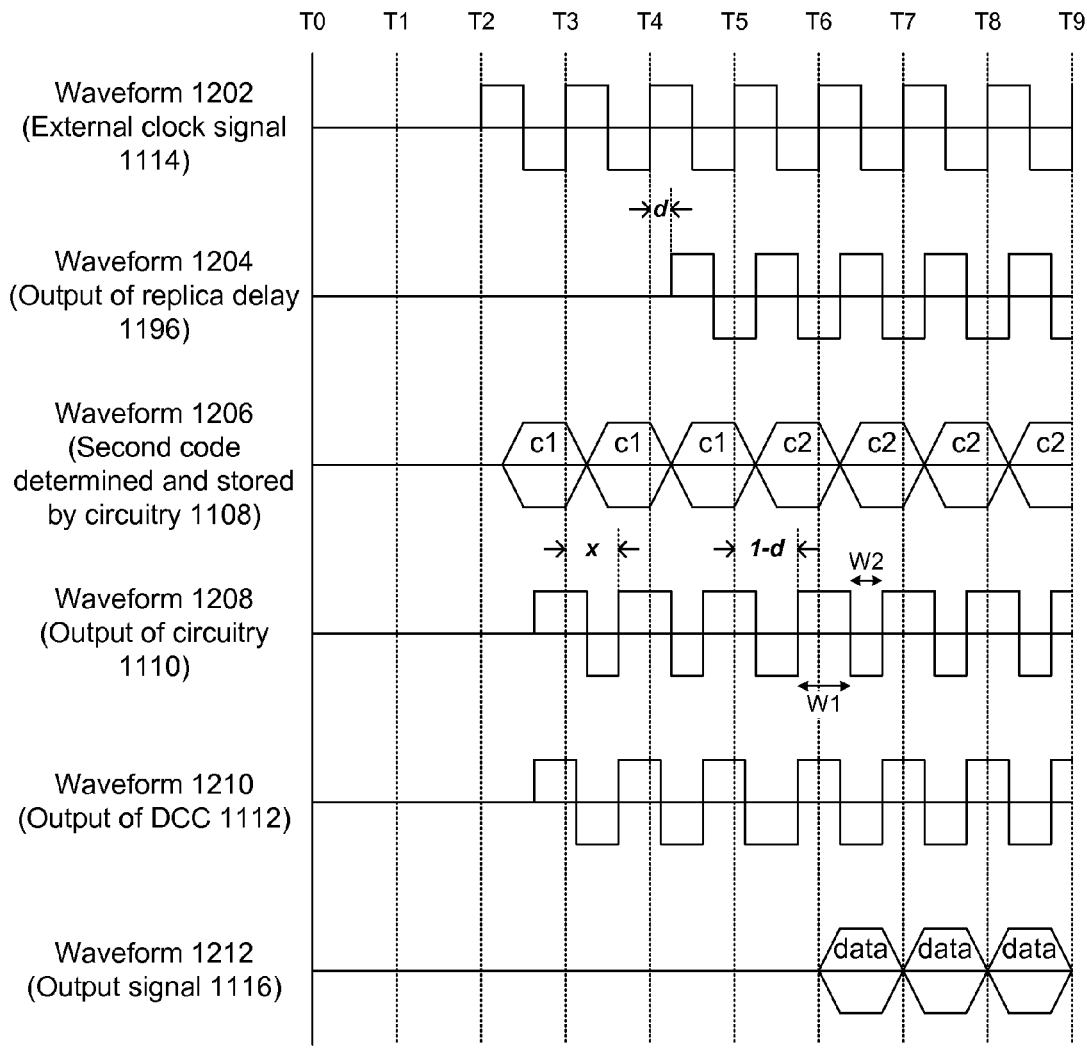
FIG. 12 illustrates some waveforms associated with the circuitry shown in FIG. 11E in accordance with some embodiments described herein.

FIG. 12 illustrates some waveforms associated with the circuitry shown in FIG. 11E in accordance with some embodiments described herein. Waveforms 1202, 1204, 1206, 1208, 1210, and 1212 correspond to external clock signal 1114, output of replica delay 1196, second code determined and stored by circuitry 1108, output of circuitry 1110, output of DCC 1112, and output signal 1116, respectively.

Waveform 1204 has a phase delay "d" with respect to waveform 1202. Waveform 1206 shows the second code that is determined and stored by circuitry 1108. When external clock signal 1114 is turned on at time T2, circuitry 1108 starts outputting the code "c1" which was previously stored by circuitry 1108. Code "c1" corresponds to phase delay "x" as shown in waveform 1208. Once circuitry 1102 locks onto external clock signal 1114, circuitry 1108 starts outputting code "c2" which is different from code "c1." Code "c2" corresponds to the phase delay "1-d." Circuitry 1110 uses code "c2" to apply a delay to the output of input circuitry 1190 which is illustrated in waveform 1208.

Waveform 1208 has deterministic jitter. Specifically, each clock cycle comprises two pulse widths: a wide pulse of width W1 and a narrow pulse of width W2. Waveform 1210 corresponds to the output of DCC 1112 in which the deterministic jitter has been substantially reduced. As shown in waveform 1212, output signal 1116 is substantially synchronized with external clock signal 1114 because the aggregate phase delay "d" that was added to external clock signal 1114 by input circuitry 1190, buffer and distribution circuitry 1192, and output circuitry 1194 is canceled out by the phase delay "1-d" that was added by circuitry 1110.

Figure 13:
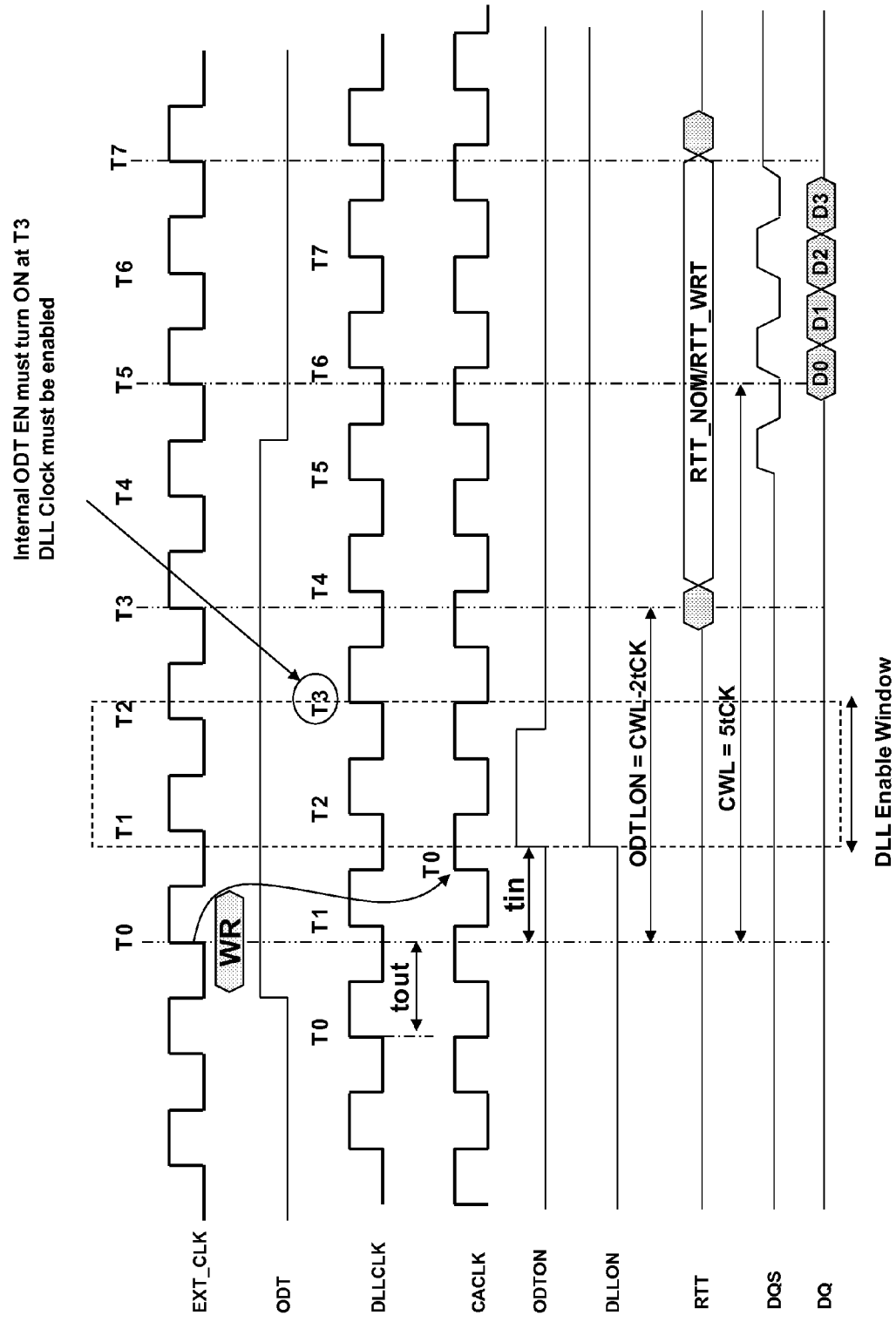
FIG. 13 illustrates some waveforms associated with the circuitry shown in FIG. 11E in accordance with some embodiments described herein.

FIG. 13 illustrates some waveforms associated with the circuitry shown in FIG. 11E in accordance with some embodiments described herein. Waveform EXT_CLK corresponds to external clock signal 1114. At time T0 a memory request is received (shown as "WR" in FIG. 13). Waveform ODT corresponds to the ODT signal that is received from the memory controller. Waveform DLLCLK corresponds to the output of DLL circuitry 1102 (i.e., either the output of DCC 1112 or the output of circuitry 1110 depending on whether or not DCC 1112 is present in circuitry 1102). Waveform CACLK corresponds to the output of input circuitry 1190 which is provided as a clock signal to the command-and-address (CA) block of the memory device.

Waveform ODTON corresponds to the ODT control signal outputted by the CA block, which instructs the ODT counter to start counting a predetermined number of cycles that corresponds to the ODT latency. Waveform DLLON corresponds to one of the signals in DLL control signal 1122. Waveform RTT corresponds to the impedance of the output driver as seen from the one or more signal lines. Waveform DQS corresponds to the clock signal that is outputted on a signal line. Waveform DQ corresponds to the data that is to be written.

The ODT turn on latency is equal to (CWL−2tCK), where CWL is the WRITE command latency. In FIG. 13, CWL is equal to five clock cycles, i.e., from time T0 to time T5 (shown as CWL in FIG. 13). The ODT latency counter starts measuring the ODT latency when the ODTON signal becomes active. Note that DLL circuitry 1102 has a very short time window (shown as "DLL enable window" in FIG. 13) during which it has to turn on and start outputting a clock signal that is synchronized with external clock signal 1114. DLL circuitry 1102 is capable of doing this because (1) even when the memory device is idle, DLL circuitry 1102 is transitioned to the DLL ON state occasionally to ensure that the clock drift is within a certain tolerance, and (2) as soon as circuitry 1102 is transitioned to the DLL ON state, circuitry 1110 immediately starts outputting a clock signal based on the second code value that was previously stored by circuitry 1108.

Figure 14:
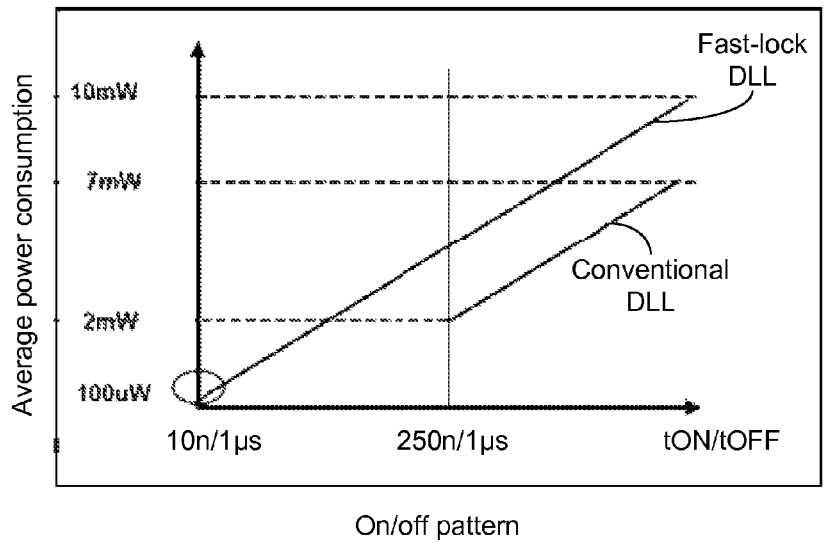
FIG. 14 presents a plot between the power consumption and the on/off pattern that is used to control DLL circuitry in accordance with some embodiments described herein.

FIG. 14 presents a plot between the power consumption and the on/off pattern that is used to control DLL circuitry 1102 in accordance with some embodiments described herein. The X-axis shows the on/off pattern. For example, point "250 ns/1 us" on the X-axis corresponds to an on/off pattern in which the DLL is turned on for about 250 nanoseconds and then switched off for about 1 microsecond. The amount of time for which the DLL is turned on has to be long enough for the DLL to lock onto external clock signal 1114. The line labeled "conventional DLL" does not extend to the left of the point labeled "250 ns/1 us" on the X-axis because the plot assumes that a conventional DLL requires at least 250 ns to lock onto external clock signal 1114. However, the line labeled "fast-lock DLL" extends all the way to the point labeled "10 ns/1 us" on the X-axis because some embodiments of a fast-lock DLL (e.g., DLL circuitry 1102) are capable of locking onto external clock signal 1114 in 10 nanoseconds. As shown in FIG. 14, a fast-lock DLL enables the power consumption to be reduced significantly by allowing the fast-lock DLL to be operated in an on/off pattern in which the DLL circuitry is turned on for a very short duration (e.g., 10 ns) and then is turned off for a relatively long duration (e.g., 1 us).

Figure 15A:
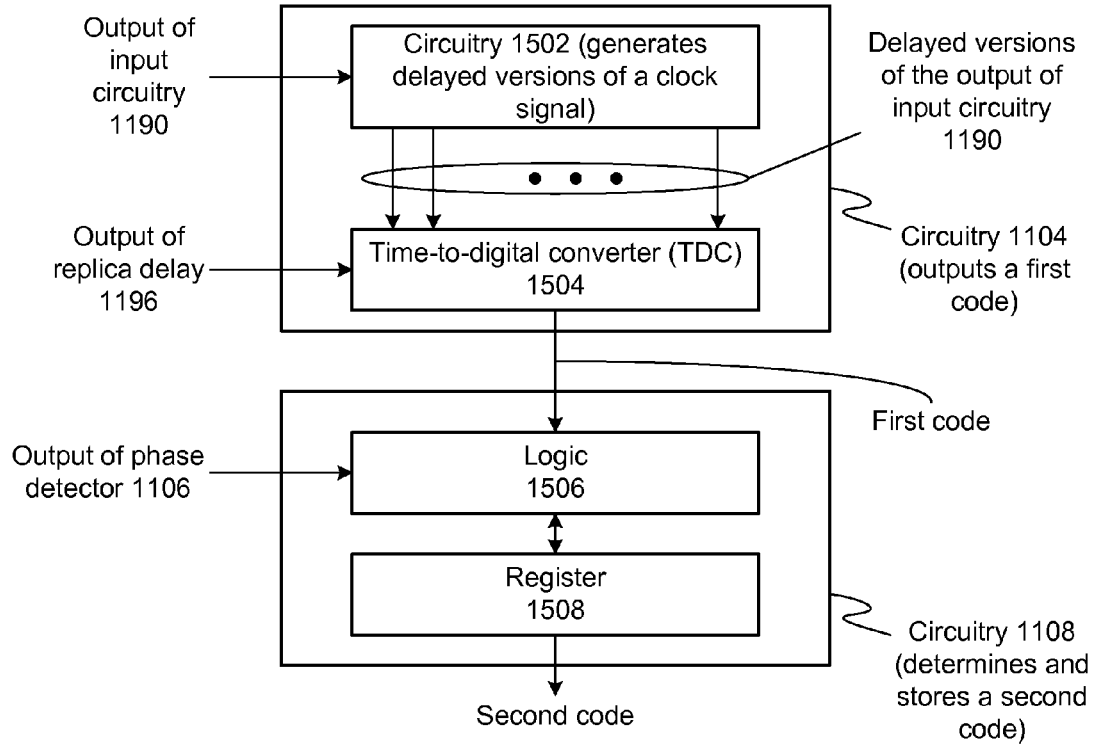
FIG. 15A illustrates some implementations of code generation circuitry in accordance with some embodiments described herein.
Figure 15B:
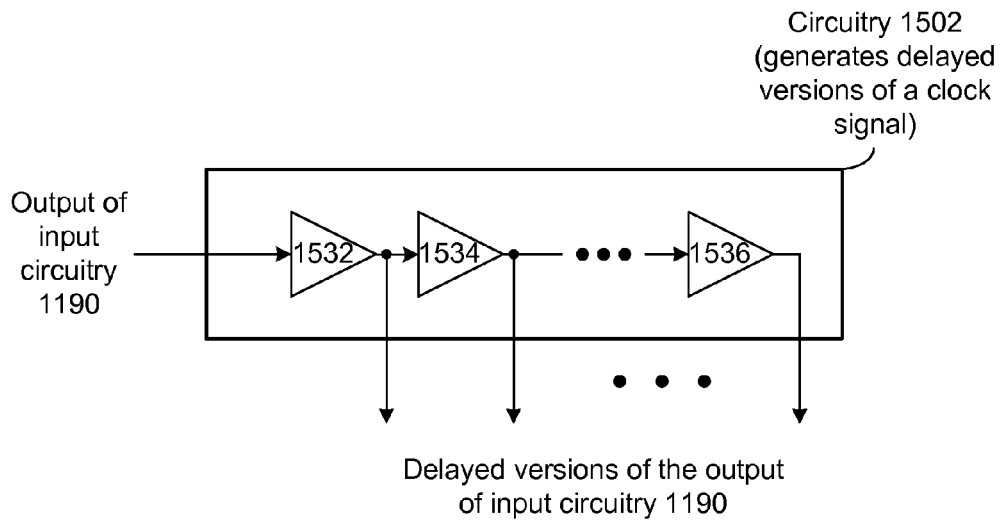
FIGS. 15B-15E illustrate different implementations of delay circuitry in accordance with some embodiments described herein.

FIG. 15A illustrates some implementations of code generation circuitry in accordance with some embodiments described herein. Circuitry 1108 includes circuitry 1502 to generate delayed versions of a clock signal, and TDC 1504. According to one definition, a TDC includes circuitry that receives a sampling clock signal CK1, and delayed versions of clock signal CK2. The TDC then outputs a code that corresponds to a phase delay between the two signals (e.g., the phase delay of CK2 with respect to CK1). In some embodiments described herein, the TDC outputs a code at each positive (or negative) edge of the sampling clock signal CK1. The TDC can issue a single sample, or multiple samples in accordance with a phase-capture request.

The output of input circuitry 1190 is provided as input to circuitry 1502, which generates delayed versions of the input. These delayed versions are then provided to TDC 1504 to produce the first code. TDC 1504 uses the output of replica delay 1196 as the sampling clock signal. The first code is then provided to logic block 1506, which generates the second code, and stores the second code in register 1508.

In some embodiments described herein, since the output of replica delay 1196 is provided to TDC 1504 as the sampling clock signal, the first code corresponds to a phase delay of "1-d," where "d" is the phase delay that corresponds to replica delay 1196. As a result, TDC 1504 itself performs the conversion of the "d" phase delay into a "1-d" phase delay, and therefore no additional circuitry is required to perform this conversion.

In some embodiments described herein, logic block 1506 includes circuitry to reduce the sensitivity to jitter in external clock signal 1114 and/or to reduce tracking bandwidth. In some embodiments described herein, logic block 1506 can accomplish this by (a) taking multiple samples of the first code and processing them (e.g., by averaging the samples or building a majority-detector from the incoming phase-stream) to produce an "up/down" or "early/late" indicator, which is then used to incrementally adjust the current value of the second code stored in register 1508, (b) limit the extent of the phase jump from the value of the second code stored in register 1508, and/or (c) turn off triggered relock and only track at a reduce update rate.

FIGS. 15B-15E illustrate different implementations of delay circuitry in accordance with some embodiments described herein. In the implementation shown in FIG. 15B, circuitry 1502 includes a delay chain comprising delay elements 1532-1536. The output of input circuitry 1190 is provided as an input to the first delay element in the delay chain, namely, delay element 1532. The outputs of the delay elements are used as the delayed versions of the output of input circuitry 1190.

Figure 15C:
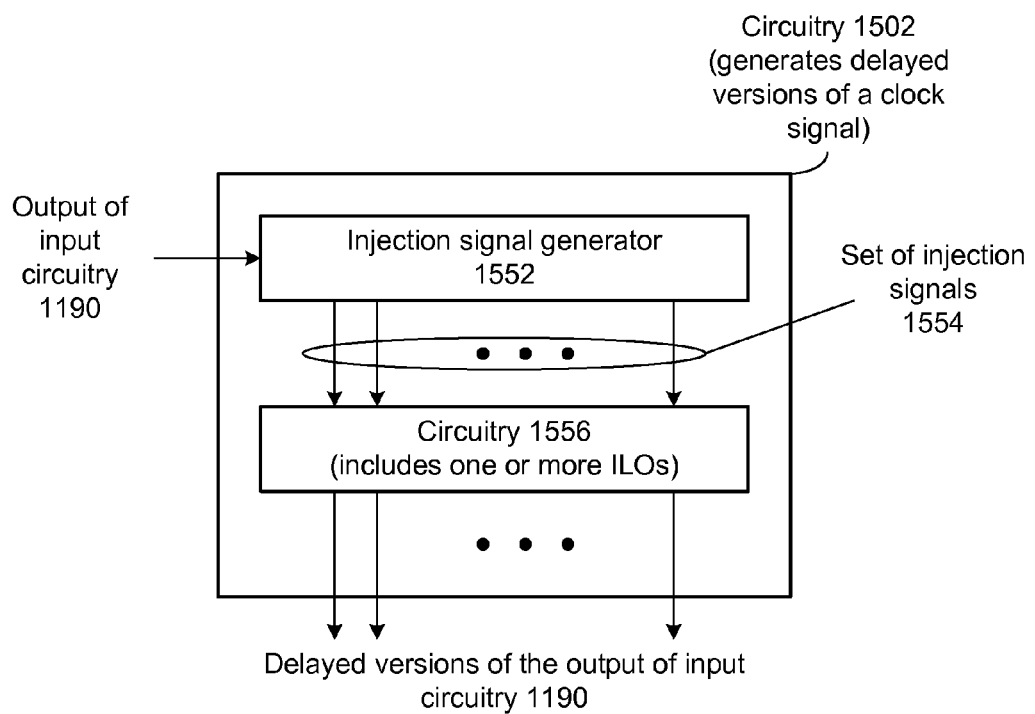

In the implementation shown in FIG. 15C, circuitry 1502 includes injection signal generator 1552 and circuitry 1556 that includes one or more ILOs. Injection signal generator 1552 generates set of injection signals 554 based on output of input circuitry 1190. Set of injection signals 1554 are injected into one or more injection locations in circuitry 1556.

An ILO includes multiple delay elements that are arranged in a loop. A delay element in the loop of an ILO may or may not invert its input signal. However, to form an oscillatory loop, an effective inversion of the signal is required. The fact that the loop inverts the signal is illustrated in the figures of this disclosure by using a rectangular box with a "-1" written inside the box. In some embodiments described herein, the rectangular box with a "-1" written inside the box represents the fact that the loop has an odd number of single-ended delay elements that invert the signal. In other embodiments, the rectangular box with a "-1" written inside the box represents the fact that the differential outputs of an odd number of differential delay elements are provided, with reverse polarity, to the next differential delay element in the loop.

Figure 15D:
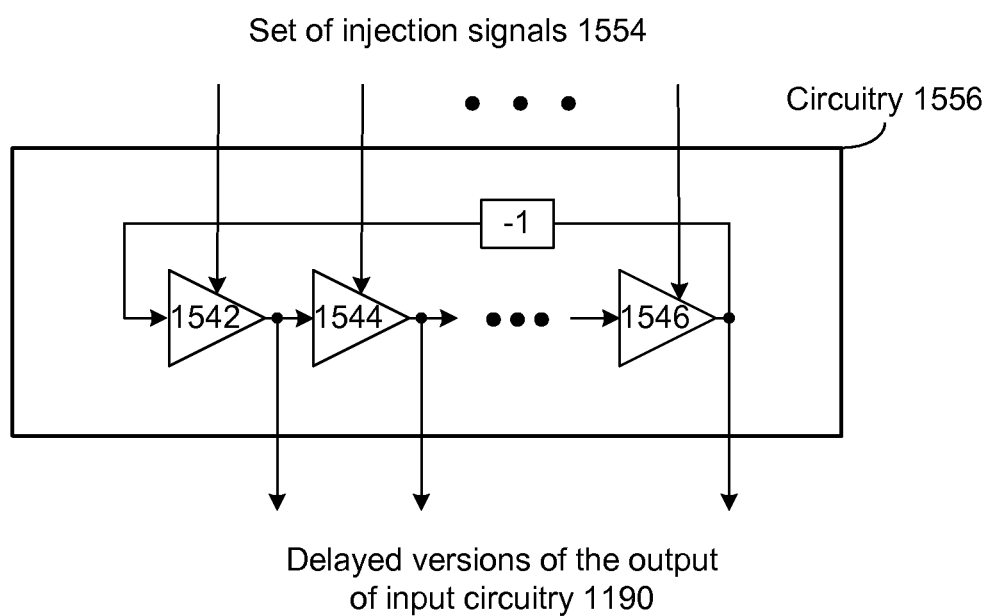

FIG. 15D illustrates an implementation of circuitry 1556 that includes a single ILO in accordance with some embodiments described herein. As shown in FIG. 15D, the outputs of the delay elements 1542-1546 of the ILO are outputted as the delayed versions of the output of input circuitry 1190.

Figure 15E:
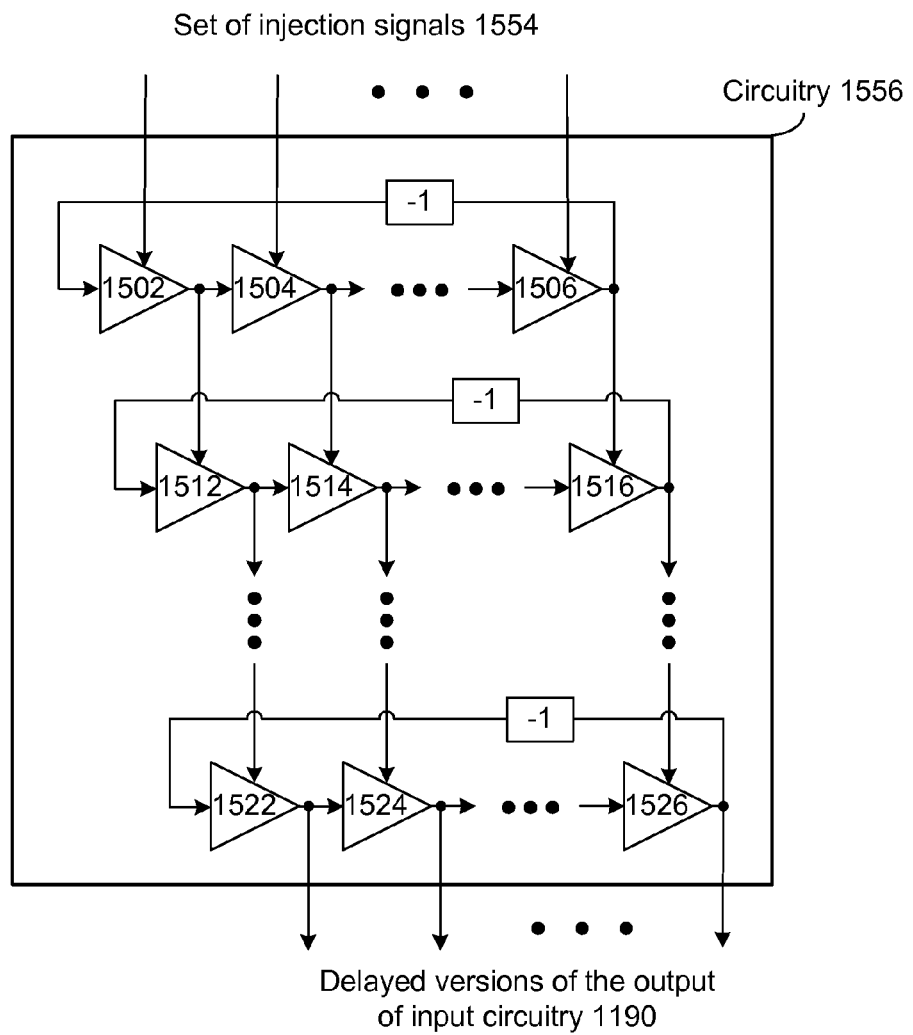

FIG. 15E illustrates an implementation of circuitry 1556 that includes a cascaded-ILO structure having multiple ILOs in accordance with some embodiments described herein. The use of multiple ILOs in a cascaded configuration can result in significantly reduced output jitter, even at the extreme of the locking range. The outputs of the delay elements of each ILO are provided as injection signals to the corresponding delay elements in the next ILO, and the outputs of the delay elements of the last ILO are outputted as the delayed versions of the output of input circuitry 1190. For example, as shown in FIG. 15E, the outputs of the delay elements 1502-1506 are provided as injection signals to corresponding delay elements 1512-1516, whose outputs are provided as injection signals to the corresponding delay elements of the next ILO, and so forth. The outputs of the delay elements 1522-1526 of the last ILO are outputted as delayed versions of the output of input circuitry 1190.

Figure 15F:
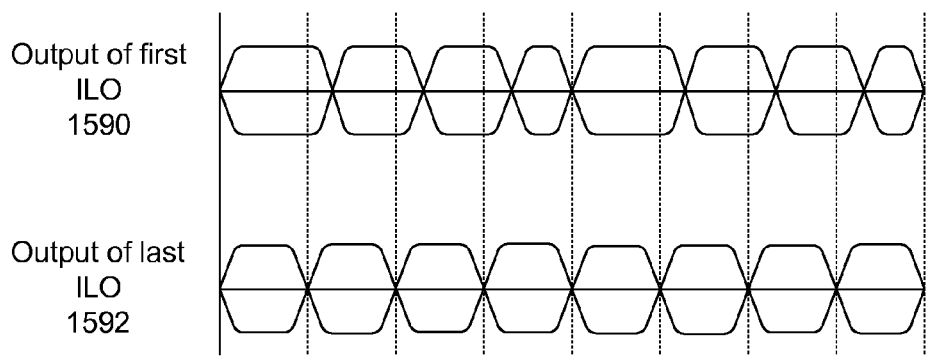
FIG. 15F illustrates waveforms that correspond to the first and last injection-locked oscillator (ILO) in a cascaded-ILO structure in accordance with some embodiments described herein.

FIG. 15F illustrates waveforms that correspond to the first and last ILO in a cascaded-ILO structure in accordance with some embodiments described herein. Waveform 1590 corresponds to the output of the first ILO. For example, waveform 1590 may correspond to the output of delay element 1502. Waveform 1592 corresponds to the output of the last ILO. For example, waveform 1592 may correspond to the output of delay element 1522. The waveforms show that the output of the last ILO has better jitter characteristics than the output of the first ILO.

FIG. 16A illustrates an implementation of circuitry 1110 that applies a delay based on a code in accordance with some embodiments described herein. As shown in FIG. 16A, circuitry 1110 includes optional pulse generator 1612, de-multiplexer/de-blender 1610, and one or more ILOs 1630.

According to one definition, the term "de-multiplexer/de-blender" refers to circuitry that is capable of providing an input signal on a selected output and/or providing an input signal with different weights (e.g., different amplitudes) on two or more selected outputs.

Output of input circuitry 1190 is provided as an input to pulse generator 1612, and the output of pulse generator 1612 is provided as an input to de-multiplexer/de-blender 1610. In embodiments that do not include pulse generator 1612, the output of input circuitry 1190 is provided directly as an input to de-multiplexer/de-blender 1610. In some embodiments, pulse generator 1612 is a one-shot pulse generator where only the rising edge or only the falling edge is used to generate the injection pulse (using only the rising edge or only the falling edge enables the duty cycle error to be completely eliminated).

De-multiplexer/de-blender 1610 selects one or more outputs from the set of outputs and optionally determines weights (when multiple outputs are selected) based on the second code that is received from circuitry 1108. The output of pulse generator 1612 is then outputted (after being adjusted in accordance with the corresponding weights, if any) on the selected output(s). The one or more outputs of de-multiplexer/de-blender 1610 are provided as injection signals to corresponding delay elements of an ILO.

FIGS. 16B-16C illustrate different implementations of the circuitry shown in FIG. 16A in accordance with some embodiments described herein. Circuitry 1110 can include one or more ILOs. If circuitry 1110 includes only one ILO, then one of the outputs (or a blended version of two or more outputs) of the delay elements of the ILO is outputted as the output of circuitry 1110. FIG. 16B illustrates an implementation of circuitry 1110 that includes one ILO in accordance with some embodiments described herein. The one or more outputs of de-multiplexer/de-blender 1610 are provided as injection signals to corresponding delay elements 1602-1606 in the ILO shown in FIG. 16B.

If circuitry 1110 includes multiple ILOs, then the outputs of the delay elements of each ILO are provided as injection signals to the corresponding delay elements in the next ILO, and one of the outputs (or a blended version of two or more outputs) of the delay elements of the last ILO is outputted as the output of circuitry 110. FIG. 16C illustrates an implementation of circuitry 1110 that includes a cascaded-ILO structure having multiple ILOs in accordance with some embodiments described herein. As shown in FIG. 16C, the outputs of the delay elements 1602-1606 are provided as injection signals to delay elements 1612-1616, whose outputs are provided as injection signals to the delay elements of the next ILO, and so forth. Output of delay element 1626 in the last ILO is outputted as the output of circuitry 1110. The output of the cascaded-ILO structure shown in FIG. 16C has better jitter characteristics than the output clock signal of a single ILO shown in FIG. 16B.

The phase delay of the output of circuitry 1110 with respect to the output of input circuitry 1190 depends on the output(s) and optionally the weight(s) that de-multiplexer/de-blender 1610 selected based on the second code. In this manner, circuitry 1110 uses the second code to apply a corresponding delay to the output of input circuitry 1190. The cascaded-ILO structure has a deterministic phase delay between different ILOs. This fact needs to be taken into account when de-multiplexer/de-blender 1610 selects output(s) based on the second code.

In some embodiments described herein, the ILOs in circuitry 1110 can be replaced by multiplying ILOs (MILOs), i.e., the frequency of the clock signal outputted by circuitry 1110 can be an integral multiple or sub-multiple of the frequency of the clock signal that is provided as input to pulse generator 1612. In this manner, circuit 1110 can be used to perform clock de-skewing as well as integral clock multiplication or division.

Various modifications to the disclosed embodiments will be readily apparent to those skilled in the art, and the general principles defined herein may be applied to other embodiments and applications without departing from the spirit and scope of the present disclosure. Some variations and modifications are now discussed.

In some embodiments, DLL control circuitry 1118 can generate DLL control signal 1122 using a low frequency oscillator (e.g., an oscillator whose frequency is an order of magnitude lower than the clock frequency at which the memory device operates) and a counter. In these embodiments, the counter is incremented based on the low frequency oscillator, and whenever the counter reaches a predetermined value, DLL control circuitry 1118 turns on DLL circuitry 1102 for a predetermined duration.

In some embodiments, DLL control signal 1122 is directly received from the memory controller and/or is based on one or more signals received from the memory controller. In these embodiments, DLL control circuitry 1118 does not generate DLL control signal 1122 based on a state machine or a timer. For example, in one implementation, the DLL may be turned on only when the memory device exits a self-refresh state that was entered into when a self-refresh command was received from the memory controller. In this implementation, DLL control circuitry 1118 includes logic to generate DLL control signal 1122 based on a self-refresh command received from a memory controller.

Figure 17A:
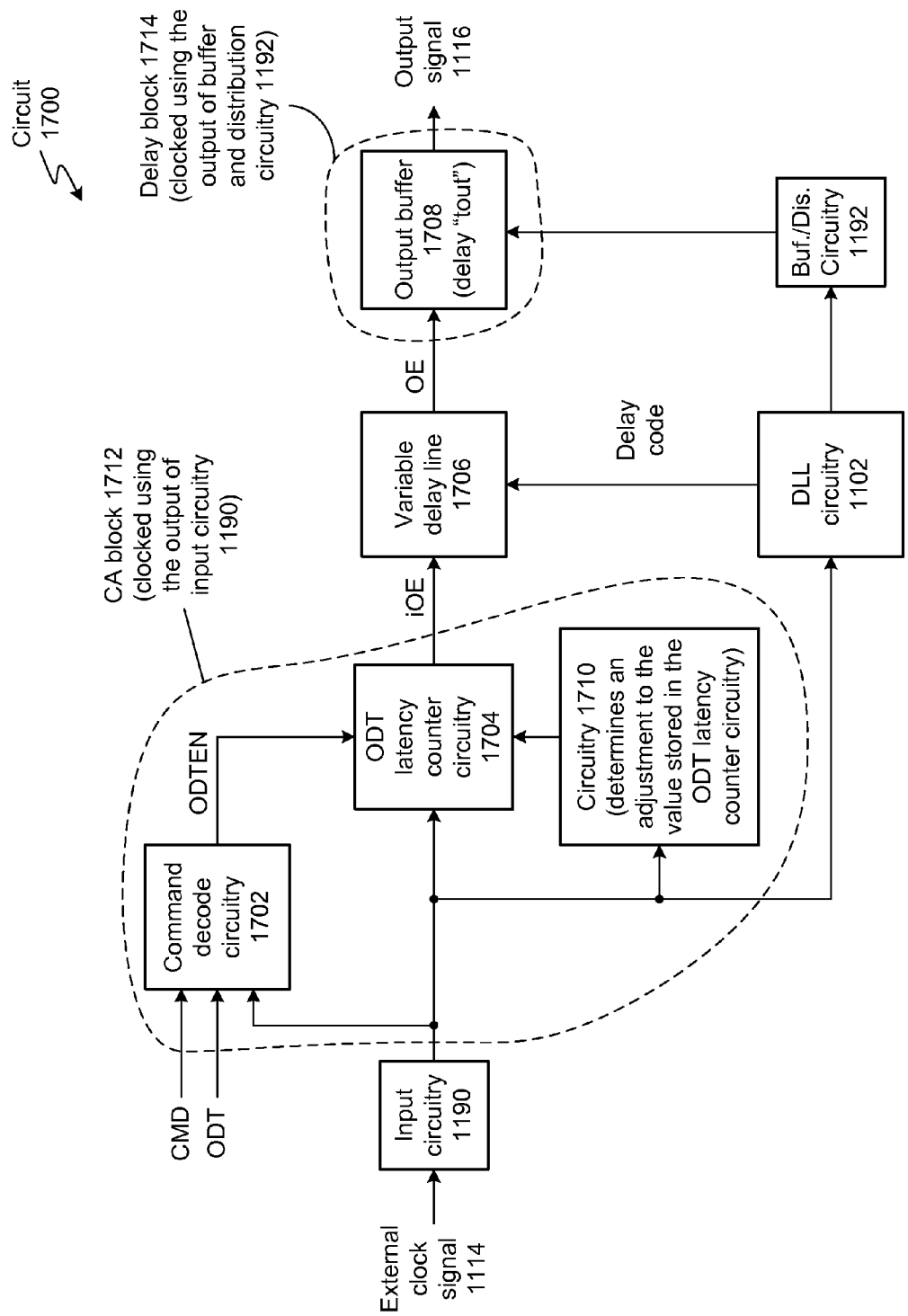
FIG. 17A illustrates how a latency counter can be implemented in a command-and-address (CA) clock domain in accordance with some embodiments described herein.

FIG. 17A illustrates how a latency counter can be implemented in the CA clock domain in accordance with some embodiments described herein. Circuit 1700 is part of a memory device that includes ODT latency counter circuitry that is clocked by the CA clock. The circuitry in CA block 1712 is clocked using the CA clock (i.e., the output of input circuitry 1190), and the circuitry in delay block 1714 is clocked using the DLL clock (i.e., the output of buffer and distribution circuitry 1192). CA block 1712 includes, inter alia, command decode circuitry 1702, ODT latency counter circuitry 1704, and circuitry 1710 to determine an adjustment to the value stored in the ODT latency counter circuitry. Delay block 1714 includes, inter alia, output buffer 1708, which corresponds to output circuitry 1194 in FIG. 11E.

Command decode circuitry 1702 generates an ODT enable signal (shown as "ODTEN" in FIG. 17A) based on a command (shown as "CMD" in FIG. 17A) and/or an ODT signal (shown as "ODT" in FIG. 17A). The ODT enable signal is to be provided to output buffer 1708 at a precise clock cycle of the DLL clock.

In some embodiments described herein, DLL circuitry 1102 is operated in an on/off pattern to significantly reduce the power consumption. In some embodiments described herein, DLL circuitry 1102 may not be able to power up quickly enough to meet the ODT latency requirements (which are often very stringent). One option is to keep DLL circuitry 1102 always on, but this option consumes more power. Another option is to increase the ODT latency requirement, but this option reduces performance. A third option, which is illustrated in FIG. 17A, is to clock the ODT latency counter using the CA clock, thereby allowing DLL circuitry 1102 to be powered down without impacting performance.

In some embodiments described herein, the memory controller provides an initial latency counter value to the memory device that corresponds to the number of DLL clock cycles by which the ODT enable signal is to be delayed before the ODT enable signal is provided to output buffer 1708. In other embodiments, the initial latency counter value may be pre-configured in the memory device.

Since ODT latency counter circuitry 1704 is clocked by the CA clock in FIG. 17A, the clock skew between the DLL clock and the CA clock needs to be taken into account. Some embodiments described herein account for the clock skew using circuitry 1710 and variable delay line 1706. The clock skew between the CA clock and the DLL clock can be viewed as having two parts: an integral portion that is equal to an integral number of clock cycles of the CA clock, and a non-integral portion that is equal to a non-integral number of clock cycles of the CA clock. Circuitry 1710 accounts for the integral portion and variable delay line 1706 accounts for the non-integral portion.

Figure 17B:
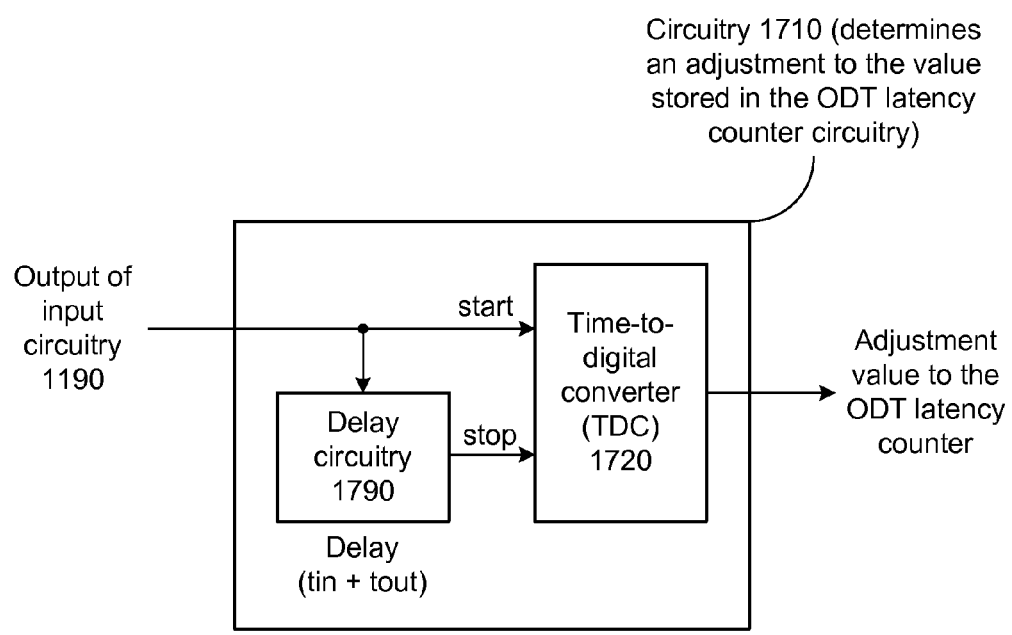
FIG. 17B illustrates an implementation of circuitry that determines an adjustment to the value stored in the on-die-termination (ODT) latency counter circuitry in accordance with some embodiments described herein.

FIG. 17B illustrates an implementation of circuitry 1710 that determines an adjustment to the value stored in the ODT latency counter circuitry 1704 in accordance with some embodiments described herein. Output of input circuitry 1190 is provided as an input to TDC 1720 and to delay circuitry 1790 whose delay is equal to the sum of delays "tin" and "tout." The output of input circuitry 1190 provides the start trigger to TDC 1720 and the output of delay circuitry 1790 provides the stop trigger to TDC 1720. The integral number of clock cycles that were counted by TDC 1720 between the start and stop triggers is provided as the adjustment value to ODT latency counter circuitry 1704. For example, if the total delay of delay circuitry 1790 is equal to 2.7 CA clock cycles, then TDC 1720 can output a binary representation of the value 2, which can then be provided to ODT latency counter circuitry 1704 (in this example, the non-integral delay of 0.7 CA clock cycles is corrected by variable delay line 1706). ODT latency counter circuitry 1704 then adjusts the initial latency counter value based on the adjustment value received from circuitry 1710. In the above example, if the initial latency counter value is equal to 5, and if the DLL clock is earlier than the CA clock, then after adjustment the latency counter value would be equal to 5−2=3.

In some embodiments described herein, the circuitry shown in FIG. 17A operates as follows. Upon receiving a command and/or an ODT signal, command decode circuitry 1702 asserts an ODT enable signal that is received by ODT latency counter circuitry 1704. ODT latency counter circuitry 1704 delays the ODT enable signal by the adjusted latency counter value. The output of ODT latency counter circuitry 1704 (shown as "iOE" in FIG. 17A) is provided as input to variable delay line 1706. Variable delay line 1706 receives the second code stored in circuitry 1108 in FIG. 11E that is used by DLL circuitry 1102 to synchronize output signal 1116 with external clock signal 1114. Note that the second code represents the non-integral portion of the clock skew between the CA clock and the DLL clock. Variable delay line 1706 applies a delay to the output of the ODT latency counter circuitry 1704 based on the second code. The output of variable delay line 1706 (shown as "OE" in FIG. 17A) is then provided as the ODT enable signal to output buffer 1708. In this manner, circuitry 1710, ODT latency counter circuitry 1704, and variable delay line 1706 enable the memory device to provide the ODT enable signal to output buffer 1708 with precise timing.

Figure 17C:
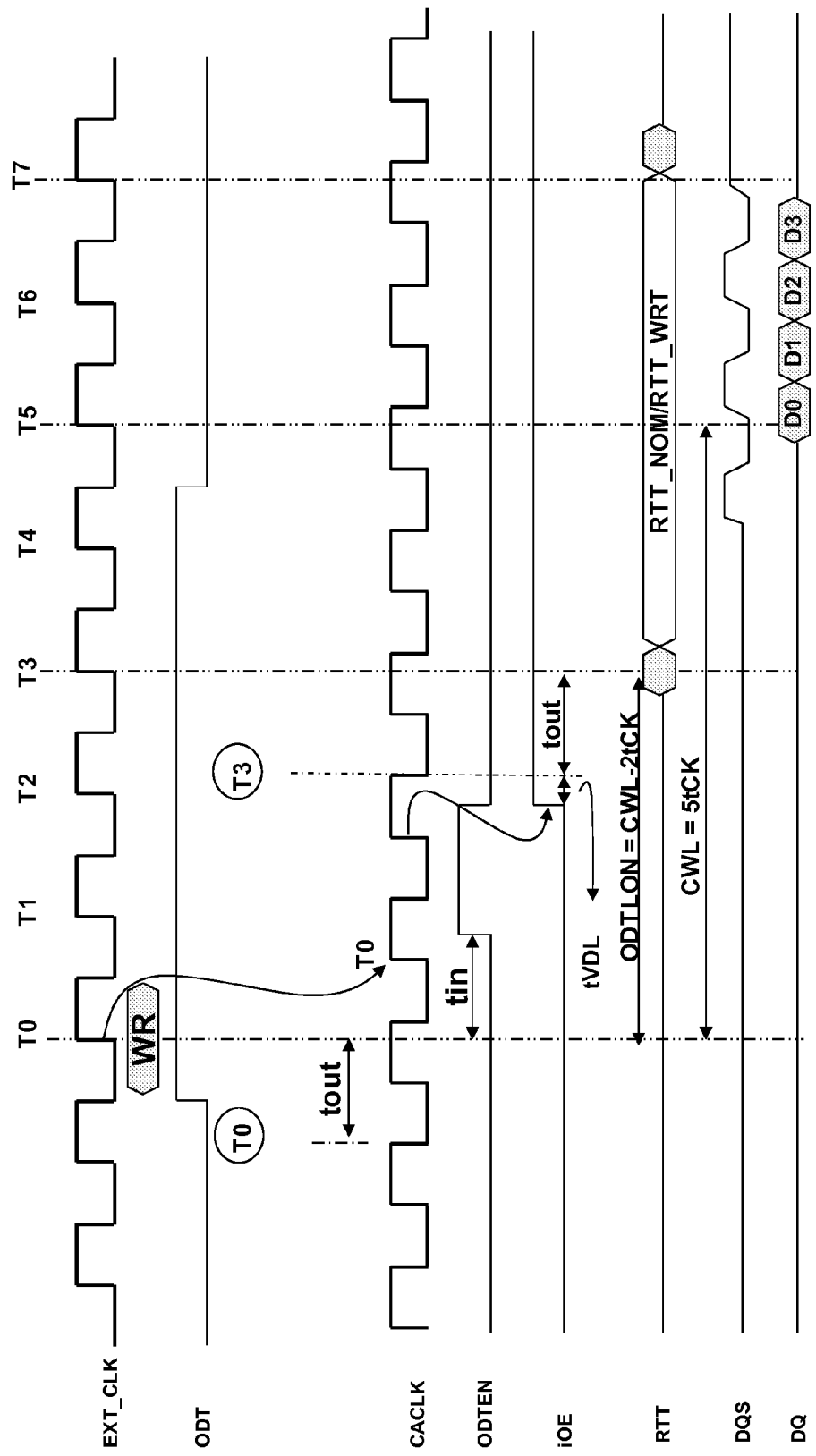
FIG. 17C illustrates some waveforms associated with the circuitry shown in FIG. 17A in accordance with some embodiments described herein.

FIG. 17C illustrates some waveforms associated with the circuitry shown in FIG. 17A in accordance with some embodiments described herein. The waveforms EXT_CLK, ODT, CACLK, RTT, DQX, and DQ are described in reference to FIG. 13. Waveform ODTEN corresponds to the output of command decode circuitry 1702. Waveform iOE corresponds to the output of ODT latency counter circuitry 1704. The labels "tin" and "tout" correspond to the delays of input circuitry 1190 and output circuitry 1194, respectively. The label "tVDL" corresponds to the delay of variable delay line 1706. Waveform RTT shows that output buffer 1708 starts changing its termination impedance precisely at clock cycle "T3" of the external clock signal 1114.

FIG. 18 illustrates a memory system in accordance with some embodiments described herein. In some embodiments described herein, a memory system includes a memory controller coupled to one or more memory devices via signal lines. For example, memory system 1800 includes memory controller 1802 coupled to memory devices 1804 and 1806 via signal lines. In some embodiments described herein, memory controller 1802 provides one or more clock signals (e.g., external clock signal 1114) and one or more command/control signals to memory devices 1804 and 1806. Memory devices 1804 and 1806 provide one or more data signals (e.g., output signal 1116) to memory controller 1802.

In some embodiments described herein, memory devices 1804 and 1806 are capable of changing the termination impedance of their output drivers depending on whether or not the output drivers are driving a signal line. As disclosed herein, memory devices 1804 and 1806 can include DLL circuitry that is capable of being operated in an on/off pattern to significantly reduce the power consumption of memory devices 1804 and 1806. As disclosed herein, memory devices 1804 and 1806 can include latency counter circuitry that is clocked using a CA clock signal.

Examples of memory devices include dynamic random access memory (DRAM) devices such as synchronous double data rate (DDR) DRAM or non volatile memory such as Flash memory. In some embodiments, memory controller 1802 is an integrated circuit device having an interface that orchestrates data flow to and from a memory device. In various embodiments, memory controller 1802 is disposed, along with one or more memory devices, on a circuit board, or may reside with the memory device in a common encapsulated package, or included in a stack configuration with the memory device (for example, in a package on package (PoP) configuration or using through silicon via (TSV) technology).

FIG. 19 illustrates a process for modifying a latency counter value based on a skew between a CA clock and a DLL clock in accordance with some embodiments described herein. The process begins by receiving a value (e.g., the initial latency counter value) that represents an amount of delay that a first circuit (e.g., ODT latency counter circuitry 1704) is to apply to a signal (e.g., the ODT enable signal) before providing the signal to a second circuit (e.g., output buffer 1708), wherein the first circuit operates using a first clock signal (e.g., the CA clock), wherein the second circuit operates using a second clock signal (e.g., the DLL clock), and wherein the amount of delay is represented with respect to the second clock signal (operation 1902). In some embodiments, memory controller 1802 may provide the initial latency counter value to memory devices 1804 and 1806. Next, an offset between the first clock signal and the second clock signal is determined (operation 1904). For example, circuitry 1710 shown in FIGS. 17A and 17B can be used to determine the offset. The value (e.g., the initial latency counter value) is then modified based on the offset (operation 1906). Thereafter, the modified latency counter value is used to delay the signal.

Some embodiments described herein provide a memory device comprising: a DLL having at least three operational states, wherein a power consumption profile of the DLL in a first operational state is greater than the power consumption profile of the DLL in a second operational state, and wherein the power consumption profile of the DLL in the second operational state is greater than the power consumption profile of the DLL in a third operational state; and circuitry to transition the DLL between operational states, wherein the circuitry transitions the DLL between the first and third operational state when the memory device is idle, and wherein the circuitry transitions the DLL between the first and second operational state when the memory device is performing a read operation. In some embodiments, the circuitry transitions the DLL from the third operational state to the first operational state if the DLL has been operating in the third operational state for a programmable amount of time. In some embodiments, the circuitry transitions the DLL from the third operational state to the first operational state when the memory device exits a self refresh state. In some embodiments, the circuitry transitions the DLL from the third operational state to the first operational state when a temperature change greater than a threshold is detected. In some embodiments, the circuitry transitions the DLL from the third operational state to the first operational state when a clock drift greater than a threshold is detected. In some embodiments, the first operational state the DLL is capable of locking onto a clock signal, wherein in the second operational state the DLL is capable of tracking clock drift in the clock signal, and wherein in the third operational state the DLL is not capable of locking onto the clock signal. In some embodiments, the circuitry transitions the DLL from the first operational state to either the second operational state or the third operational state after the DLL locks onto a clock signal.

Some embodiments described herein provide an IC comprising: a DLL having at least two operational states, wherein a power consumption profile of the DLL in the first operational state is greater than the power consumption profile of the DLL in the second operational state; and circuitry to operate the DLL in the second operational state and transition the DLL to the first operational state to establish a lock on a first clock signal, wherein the circuitry transitions the DLL to the first operational state based on a trigger that is generated at least when the DLL has been operating in the second operational state for a programmable amount of time. In some embodiments, in the first operational state the DLL is capable of locking onto the clock signal in less than 20 nanoseconds. In some embodiments, the trigger is additionally generated when a temperature change greater than a threshold is detected. In some embodiments, the trigger is additionally generated when a clock drift greater than a threshold is detected.

In some embodiments, the DLL comprises: first circuitry to generate a first clock signal by delaying an input clock signal by a first delay; second circuitry to determine a code based on the input clock signal and the first clock signal, wherein the code represents a second delay which, when applied to the first clock signal, produces a second clock signal that has a desired phase delay with respect to the input clock signal; and third circuitry to produce an output clock signal based on the input clock signal and the code, wherein the third circuitry is capable of delaying the input clock signal by the second delay.

Some embodiments described herein provide a memory device, comprising: first circuitry clocked using a first clock signal, wherein the first circuitry outputs a signal; a counter storing a value that represents a delay amount with respect to a second clock signal; third circuitry clocked using the first clock signal to modify the value stored in the counter based on a clock skew between the first clock signal and the second clock signal; fourth circuitry clocked using the first clock signal to delay the signal based on the modified value stored in the counter; and fifth circuitry to delay the signal based on the clock skew between the first clock signal and the second clock signal. In some embodiments, the signal is an on-die-termination signal.

Some embodiments described herein provide a method comprising: operating a first circuit based on a first clock signal; operating a second circuit based on a second clock signal; storing a value that represents an amount of delay that the first circuit is to apply to a first signal before providing the first signal to the second circuit, wherein the amount of delay is represented with respect to the second clock signal; modifying the value based on a clock skew between the first clock signal and the second clock signal; and the first circuit applying the amount of delay to the first signal according to the modified value before providing the first signal to the second circuit. In some embodiments, the first circuit includes command-and-address circuitry of a memory device, and wherein the second circuit includes output buffer circuitry of the memory device. In some embodiments, the first signal is an on-die-termination signal.

The methods and/or processes that have been implicitly or explicitly described in this disclosure can be embodied in hardware, software, or a combination thereof. Hardware embodiments include, but are not limited to, IC chips, field-programmable gate arrays (FPGAs), system-on-chips (SoCs), application specific integrated circuits (ASICs), etc.

Various modifications to the disclosed embodiments will be readily apparent to those skilled in the art, and the general principles defined herein may be applied to other embodiments and applications without departing from the spirit and scope of the present disclosure. Thus, the scope of the present disclosure is not limited to the embodiments shown, but is to be accorded the widest scope consistent with the principles and features disclosed herein.

What is claimed is:

1. An integrated circuit (IC), comprising:
    first circuitry to generate a first clock signal by delaying an input clock signal by a first delay;
    a set of delay elements to generate a set of delayed versions of the input clock signal, wherein each delayed version of the input clock signal has a different delay;
    a time-to-digital converter (TDC) to generate a code based on the first clock signal and the set of delayed versions of the input clock signal;
    one or more injection-locked oscillators (ILOs) having a set of injection locations, wherein an output of an ILO in the one or more ILOs is provided as the output clock signal; and
    a de-multiplexer to inject an injection signal into an injection location that is selected from the set of injection locations based on the code, wherein the injection signal is generated based on the input clock signal.

2. The IC of claim 1, wherein the first delay is substantially equal to a buffer delay of a clock buffer.

3. The IC of claim 2, wherein the clock buffer receives the output clock signal as an input.

4. The IC of claim 2, further comprising:
    a duty-cycle corrector (DCC) to adjust a duty cycle of the output clock signal, wherein an output signal of the DCC is provided as an input to the clock buffer.

5. The IC of claim 1, wherein the desired phase delay is zero.

6. The IC of claim 1, wherein the set of delay elements are part of an ILO, wherein the input clock signal is used to generated an injection signal for the ILO, and wherein output signals of different delay elements in the set of delay elements correspond to the first set of delayed versions of the input clock signal.

7. The IC of claim 1, wherein the set of delay elements are part of a chain of delay elements, wherein the input clock signal is provided as an input to the first delay element in the chain of delay elements, and wherein output signals of different delay elements in the chain of delay elements correspond to the first set of delayed versions of the input clock signal.

8. The IC of claim 1, wherein the TDC comprises:
a first TDC to generate a first component of the code based on the first clock signal and the first set of delayed versions of the input clock signal;
a multiplexer to select a first delayed signal from the first set of delayed versions of the input clock signal based on the first component of the code; and
second circuitry to generate a second component of the code based on the first clock signal and the first delayed signal.

9. The IC of claim 8, wherein the second circuitry comprises:
third circuitry to generate a set of delayed versions of the first delayed signal, wherein each delayed version of the first delayed signal has a different delay; and
a second TDC to generate a second component of the code based on the first clock signal and the second set of delayed versions of the first delayed signal.

10. The IC of claim 8, wherein the second circuitry comprises:
third circuitry to sample the first delayed signal at multiple time instances to obtain a set of samples; and
fourth circuitry to generate a second component of the code based on the set of samples.

11. The IC of claim 1, wherein the TDC generates the code while operating in a first operational state, and wherein after generating the code at least the TDC is transitioned from the first operational state to a second operational state, wherein the TDC consumes less power in the second operational state than in the first operational state.

12. The IC of claim 11, further comprising:
a phase detector to update the code when the TDC is operating in the second operational state.

13. A memory device, comprising:
first circuitry to generate a first clock signal by delaying an input clock signal by a delay that is substantially equal to a buffer delay of a clock buffer;
a set of delay elements to generate a set of delayed versions of the input clock signal, wherein each delayed version of the input clock signal has a different delay;
a time-to-digital converter (TDC) to generate a code based on the first clock signal and the set of delayed versions of the input clock signal;
one or more injection-locked oscillators (ILOs) having a set of injection locations, wherein an output of an ILO in the one or more ILOs is provided as the output clock signal, wherein the output clock signal is provided as an input to the clock buffer; and
a de-multiplexer to inject an injection signal into an injection location that is selected from the set of injection locations based on the code, wherein the injection signal is generated based on the input clock signal.

14. The memory device of claim 13, wherein a duty cycle of the output clock signal is adjusted before providing the output clock signal as the input to the clock buffer.

15. The memory device of claim 13, wherein the TDC generates the code while operating in a first operational state, and wherein after generating the code at least the TDC is transitioned from the first operational state to a second operational state, wherein the TDC consumes less power in the second operational state than in the first operational state.

16. The memory device of claim 15, further comprising:
a phase detector to update the code when the TDC is operating in the second operational state.

17. A method, comprising:
delaying an input clock signal by a first delay to produce a first clock signal;
generating a set of delayed versions of the input clock signal, wherein each delayed version of the input clock signal has a different delay;
generating a set of samples by sampling the set of delayed versions of the input clock signal based on the first clock signal;
generating a code based on the set of samples;
producing an output clock signal based on the input clock signal and the code, wherein said producing includes delaying the input clock signal by the second delay that corresponds to the code; and
providing the output signal as a buffer input signal to a clock buffer.

18. The method of claim 17, wherein said producing includes adjusting a duty cycle of the output clock signal.

19. The method of claim 17, wherein said generating the set of delayed versions of the input clock signal comprises:
generating one or more injection signals based on the input clock signal;
injecting the one or more injection signals into one or more injection locations of an injection locked oscillator (ILO); and
providing output signals of the ILO as the set of delayed versions of the input clock signal.

20. The method of claim 17, wherein said producing the output clock signal comprises:
generating one or more injection signals based on the input clock signal;
injecting the one or more injection signals into one or more injection locations of an injection locked oscillator (ILO) based on the code; and providing an output signal of the ILO as the output clock signal.

* * * * *